US008389389B2

(12) United States Patent
Kishimoto et al.

(10) Patent No.: US 8,389,389 B2
(45) Date of Patent: Mar. 5, 2013

(54) SEMICONDUCTOR LAYER MANUFACTURING METHOD, SEMICONDUCTOR LAYER MANUFACTURING APPARATUS, AND SEMICONDUCTOR DEVICE MANUFACTURED USING SUCH METHOD AND APPARATUS

(75) Inventors: Katsushi Kishimoto, Osaka (JP); Yusuke Fukuoka, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 628 days.

(21) Appl. No.: 12/521,080

(22) PCT Filed: Dec. 5, 2007

(86) PCT No.: PCT/JP2007/073437

§ 371 (c)(1), (2), (4) Date: Jun. 24, 2009

(87) PCT Pub. No.: WO2008/078518

PCT Pub. Date: Jul. 3, 2008

(65) Prior Publication Data

US 2010/0024872 A1 Feb. 4, 2010

(30) Foreign Application Priority Data

Dec. 27, 2006 (JP) ................................ 2006-351988

(51) Int. Cl.
*H01L 21/20* (2006.01)

(52) U.S. Cl. .. 438/507; 438/905; 438/935; 257/E21.226

(58) Field of Classification Search .................. 438/492, 438/57, 905, 935, 711, 507; 257/E21.09, 257/E31.032, E21.226, E21.227; 117/84
See application file for complete search history.

(56) References Cited

U.S. PATENT DOCUMENTS 6,200,825 B1 3/2001 Yoshimi et al.
6,810,897 B2 11/2004 Girard et al.

(Continued)

FOREIGN PATENT DOCUMENTS

| | | |
|---|---|---|
| EP | 1 258 541 | 11/2002 |
| JP | 2000-252495 | 9/2000 |
| JP | 2002-339071 | 11/2002 |
| JP | 2003-77839 | 3/2003 |
| JP | 2004-6537 | 1/2004 |

(Continued)

OTHER PUBLICATIONS

International Search Report for PCT/JP2007/073437, mailed Feb. 5, 2008.

*Primary Examiner* — Julio J Maldonado
*Assistant Examiner* — Amar Movva
(74) *Attorney, Agent, or Firm* — Nixon & Vanderhye, P.C.

(57) ABSTRACT

Provided are a semiconductor layer manufacturing method and a semiconductor manufacturing apparatus capable of forming a high quality semiconductor layer even by a single chamber system, with a shortened process time required for reducing a concentration of impurities that exist in a reaction chamber before forming the semiconductor layer. A semiconductor device manufactured using such a method and apparatus is also provided. The present invention relates to a semiconductor layer manufacturing method of forming a semiconductor layer inside a reaction chamber (101) capable of being hermetically sealed, including an impurities removing step of removing impurities inside the reaction chamber (101) using a replacement gas, and a semiconductor layer forming step of forming the semiconductor layer, the impurities removing step being a step in which a cycle composed of a replacement gas introducing step of introducing the replacement gas into the reaction chamber (101) and an exhausting step of exhausting the replacement gas is repeated a plurality of times, the impurities removing step being performed at least before the semiconductor layer forming step.

13 Claims, 10 Drawing Sheets

ST1 CONDITION SETTING STEP
ST2 IMPURITIES REMOVING STEP
ST3 FIRST CONDUCTIVE LAYER FORMING STEP
ST4 BUFFER LAYER FORMING STEP
ST2 IMPURITIES REMOVING STEP
ST5 PHOTOELECTRIC CONVERSION LAYER FORMING STEP
ST6 SECOND CONDUCTIVE LAYER FORMING STEP

U.S. PATENT DOCUMENTS

2004/0002220 A1 1/2004 Mizushima
2005/0115504 A1 6/2005 Ueda et al.
2006/0163603 A1 7/2006 Takeuchi et al.

FOREIGN PATENT DOCUMENTS

JP 2004-104056 4/2004
TW 1231053B B 4/2005
WO WO 2005/093799 10/2005

SEMICONDUCTOR LAYER MANUFACTURING METHOD, SEMICONDUCTOR LAYER MANUFACTURING APPARATUS, AND SEMICONDUCTOR DEVICE MANUFACTURED USING SUCH METHOD AND APPARATUS

This application is the U.S. national phase of International Application No. PCT/JP2007/073437 filed 5 Dec. 2007, which designated the U.S. and claims priority to Japan Application No. 2006-351988 filed 27 Dec. 2006, the entire contents of each of which are hereby incorporated by reference.

TECHNICAL FIELD the technology disclosed herein relates to a semiconductor layer manufacturing method, a semiconductor layer manufacturing apparatus, and a semiconductor device manufactured using such a method and apparatus. More specifically, the technology disclosed herein relates to a semiconductor layer manufacturing method and a semiconductor layer manufacturing apparatus for manufacturing a semiconductor layer made of semiconductor thin films by a single chamber system, using for example plasma CVD or the like, and a semiconductor device manufactured using such a method and apparatus.

BACKGROUND ART

Recently, thin film photoelectric conversion elements formed by plasma CVD using a gas as a raw material have been attracting attention. Examples of such thin film photoelectric conversion elements include a silicon-based thin film photoelectric conversion element made of silicon-based thin films, a thin film photoelectric conversion element made of a CIS ($CuInSe_2$) compound or a CIGS ($Cu(In, Ga)Se_2$) compound, and the like. Development and product expansion of such thin film photoelectric conversion elements have been promoted. These photoelectric conversion elements have a major characteristic that they have the possibility of achieving both lower cost and higher performance, as they are formed by stacking a semiconductor layer or a metal electrode film on an inexpensive large-area substrate using a forming apparatus such as a plasma CVD apparatus or a sputtering apparatus, and then separating/connecting photoelectric conversion elements fabricated on the same substrate by laser patterning. In such a manufacturing process, however, an increase in the cost of a semiconductor layer manufacturing apparatus, which is a main apparatus for fabricating a device and represented by a plasma CVD apparatus, leads to an increase in the manufacturing cost of the photoelectric conversion elements, posing a barrier to widespread use thereof.

In view of such a problem, for example, Japanese Patent Laying-Open No. 2000-252495 (Patent Document 1) discloses a single chamber system successively forming a p-type semiconductor layer, an i-type crystalline silicon-based photoelectric conversion layer, and an n-type semiconductor layer in order inside the same plasma CVD forming chamber. With this system, the number of forming chambers can be reduced and the facility can be simplified, when compared with an in-line system and a multiple chamber system forming respective layers in separate forming chambers. Further, transfer between forming chambers is not required, reducing manufacturing time for a photoelectric conversion element.

Furthermore, Japanese Patent Laying-Open No, 2000-252495 (Patent Document 1) has a description "In order to prevent conductivity-type determining impurity atoms doped into a p-type semiconductor layer and an n-type semiconductor layer from being introduced into a semiconductor layer of a different type, it is necessary to sufficiently replace gas in the deposition chamber before forming respective semiconductor layers, for example by gas replacement for one hour using a purge gas such as hydrogen. Even when such a gas replacement process is performed, it has been impossible to attain good performance of an amorphous silicon solar cell. Therefore, the single chamber system has been used only for experimental purposes". Accordingly, a method of forming a photoelectric conversion element having an amorphous silicon-based photoelectric conversion layer by the single chamber system has not been put to practical use.

Japanese Patent Laying-Open No. 2004-006537 (Patent Document 2) describes that auto-doping of boron into an i-type semiconductor layer can be suppressed by removing $B_2H_6$ gas and a substance caused by the $B_2H_6$ gas in a chamber, after formation of a p-type semiconductor layer, by (1) vacuum exhaust of the chamber, (2) gas replacement using $H_2$ or $SiH_4$ or both, and (3) plasma cleaning using an etching gas such as hydrogen gas.

However, there is a problem that, in the case of forming a semiconductor layer in a reaction chamber by plasma CVD, it is necessary to perform gas replacement for a long period of time in order to remove impurities that exist in the reaction chamber by gas replacement before forming the semiconductor layer and form a high quality semiconductor layer.

Further, as described in the above-mentioned techniques, in the method of forming a semiconductor layer of a thin film photoelectric conversion element by which a photoelectric conversion element having a p-type semiconductor layer, an i-type semiconductor layer, and an n-type semiconductor layer is formed in the same reaction chamber by plasma CVD (i.e., single chamber system), conductivity-type determining impurity atoms doped into the p-type semiconductor layer and the n-type semiconductor layer are also introduced into a semiconductor layer of a different type, making it difficult to obtain a photoelectric conversion element with a good photoelectric conversion property. In particular, it is difficult and not operational at present to apply the single chamber system to an amorphous silicon-based thin film photoelectric conversion element.

Patent Document 1: Japanese Patent Laying-Open No. 2000-252495

Patent Document 2: Japanese Patent Laying-Open No. 2004-006537

The technology disclosed herein provides a semiconductor layer manufacturing method and a semiconductor layer manufacturing apparatus capable of forming a high quality semiconductor layer even by a single chamber system, with a shortened process time required for reducing a concentration of impurities that exist in a reaction chamber before forming the semiconductor layer, and provide a semiconductor device manufactured using such a method and apparatus.

The technology disclosed herein relates to a semiconductor layer manufacturing method of forming a semiconductor layer inside a reaction chamber capable of being hermetically sealed, including: an impurities removing step of removing impurities inside the reaction chamber using a replacement gas, and a semiconductor layer forming step of forming the semiconductor layer, the impurities removing step being a step in which a cycle composed of a replacement gas introducing step of introducing the replacement gas into the reaction chamber and an exhausting step of exhausting the replacement gas is repeated a plurality of times, the impurities removing step being performed at least before the semiconductor layer forming step.

Preferably, in the semiconductor layer manufacturing method of the technology disclosed herein, the semiconductor layer includes a plurality of layers having different conductivity types, and the semiconductor layer is formed inside the same reaction chamber.

Preferably, in the semiconductor layer manufacturing method of the technology disclosed herein, a pressure after introducing the replacement gas and a pressure after exhausting the replacement gas inside the reaction chamber are set beforehand; in the replacement gas introducing step, exhaust from the reaction chamber is stopped, and when a pressure inside the reaction chamber is increased to greater than or equal to the pressure after introducing the replacement gas, introduction of the replacement gas is stopped and the replacement gas introducing step is terminated; and, in the exhausting step, introduction of the replacement gas is stopped, and when the pressure inside the reaction chamber is reduced to less than or equal to the pressure after exhausting the replacement gas, the exhaust is stopped and the exhausting step is terminated.

Preferably, in the semiconductor layer manufacturing method of the technology disclosed herein, an allowable concentration [N] (unit: atoms/cm.sup.3) of impurity atoms inside the reaction chamber immediately before the semiconductor layer forming step is set beforehand, and a number n (unit: number of times) of the cycle satisfies an expression:

$$[N]_o \times (M/m)^n \leqq [N]$$

where $[N]_o$ (unit: atoms/$cm^3$) represents a concentration of impurity atoms inside the reaction chamber before starting the cycle, m (unit: Pa) represents the pressure after introducing the replacement gas, and M (unit: Pa) represents the pressure after exhausting the replacement gas.

Preferably, in the semiconductor layer manufacturing method of the technology disclosed herein, a background pressure inside the reaction chamber immediately before the semiconductor layer forming step is greater than or equal to 0.1 Pa and less than or equal to 10000 Pa.

Preferably, in the semiconductor layer manufacturing method of the technology disclosed herein, the semiconductor layer is a semiconductor layer used in a photoelectric conversion element, and includes a p-type layer, an i-type layer, and an n-type layer; the semiconductor layer forming step includes a first conductive layer forming step of forming a first conductive layer made of a p-type layer or an n-type layer, a photoelectric conversion layer forming step of forming a photoelectric conversion layer made of an i-type layer on the first conductive layer, and a second conductive layer forming step of forming a second conductive layer made of a p-type layer or an n-type layer on the photoelectric conversion layer; and the first conductive layer and the second conductive layer are formed to have conductivity types different from each other.

Preferably, the semiconductor layer manufacturing method of the technology disclosed herein further includes a buffer layer forming step of forming a buffer layer made of an i-type layer between the first conductive layer forming step and the photoelectric conversion layer forming step.

Preferably, the semiconductor layer manufacturing method of the technology disclosed herein further includes the impurities removing step between the first conductive layer forming step and the buffer layer forming step.

Preferably, the semiconductor layer manufacturing method of the technology disclosed herein further includes the impurities removing step between the buffer layer forming step and the photoelectric conversion layer forming step.

Preferably, in the semiconductor layer manufacturing method of the technology disclosed herein, the buffer layer includes a plurality of layers, and the impurities removing step is further performed after each buffer layer is formed in the buffer layer forming step.

Preferably, in the semiconductor layer manufacturing method of the technology disclosed herein, the replacement gas is at least any of gases used to form an i-type layer.

Preferably, in the semiconductor layer manufacturing method of the technology disclosed herein, the semiconductor layer is made of a stack body of a plurality of pin semiconductors.

Further, the technology disclosed herein relates to a semiconductor layer manufacturing apparatus used for any of the semiconductor layer manufacturing methods described above, including a reaction chamber capable of being hermetically sealed for forming a semiconductor layer therein, a gas introducing portion for introducing a replacement gas into the reaction chamber, and a gas exhausting portion for exhausting the replacement gas from the reaction chamber.

Further, the technology disclosed herein relates to a semiconductor device, including a substrate, and a semiconductor layer and an electrode formed on the substrate, the semiconductor layer being manufactured using any of the semiconductor layer manufacturing methods described above or any of the semiconductor layer manufacturing apparatuses described above.

In the semiconductor layer manufacturing method and the semiconductor layer manufacturing apparatus of the technology disclosed herein, an operation of replacing a gas inside the reaction chamber is repeated a plurality of times before forming the semiconductor layer, and thus a concentration of impurity atoms that exist inside the reaction chamber can be reduced. Thereby, a concentration of impurities incorporated into the semiconductor layer can be reduced, and a high quality semiconductor layer can be manufactured even by a single chamber system. Further, in the technology disclosed herein, since process time required for reducing impurities can be shortened by performing the gas replacement operation a plurality of times, excellent mass productivity can also be obtained. Therefore, according to the technology disclosed herein, a high quality semiconductor device can be manufactured with good mass productivity.

Figure 1:
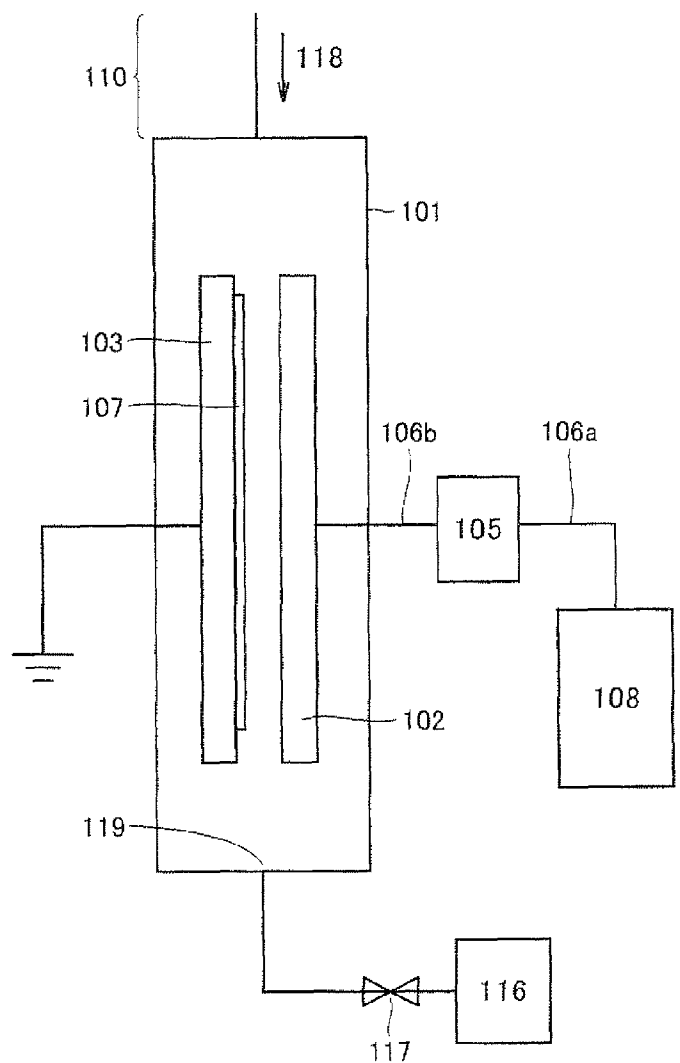
FIG. 1 is a schematic cross sectional view of a semiconductor layer manufacturing apparatus used in the technology disclosed herein.

The following reference numerals are included herein: 101: reaction chamber, 102: cathode electrode, 103: anode electrode, 105: impedance matching circuit, 106*a*, 106*b*: electric power introducing line, 107: substrate, 108: electric power supplying portion, 110: gas introducing portion, 116: gas exhausting portion, 117: pressure regulating valve, 118: gas 119: gas exhaust port, 200, 303, 305: thin film photoelectric conversion element, 201: first electrode, 202, 202*a*, 202*b*, 202*c*: first conductive layer, 203, 203*a*, 203*b*: buffer layer, 204, 204*a*, 204*b*, 204*c* photoelectric conversion layer, 205, 205*a*, 205*b*, 205*c*: second conductive layer, 206: second electrode, 207: semiconductor layer, 301*a*: first pin structure stack body, 301*b*, 301*c*: second pin structure stack body, 302, 304: double pin structure stack body, 401: glass substrate, 402: p-type amorphous silicon semiconductor layer, 403: i-type microcrystalline silicon semiconductor layer, 404: amorphous silicon layer.

SUMMARY

Hereinafter, a semiconductor layer manufacturing method, a semiconductor layer manufacturing apparatus, and a semiconductor device obtained using such a method and apparatus in accordance with the technology disclosed herein will be described in more detail.

In a semiconductor layer manufacturing method of the technology disclosed herein, a semiconductor layer is formed inside a reaction chamber capable of being hermetically sealed. The semiconductor layer manufacturing method of the technology disclosed herein includes an impurities removing step of removing impurities inside the reaction chamber using a replacement gas, and a semiconductor layer forming step of forming the semiconductor layer. The impurities removing step is a step in which a cycle composed of a replacement gas introducing step of introducing the replacement gas into the reaction chamber and an exhausting step of exhausting the replacement gas is repeated a plurality of times. Further, the impurities removing step is performed at least before the semiconductor layer forming step.

In the technology disclosed herein, an operation of replacing a gas inside the reaction chamber is repeated a plurality of times before the semiconductor layer forming step, and thus a concentration of impurity atoms that exist inside the reaction chamber is reduced. Thereby, a concentration of impurities incorporated into the semiconductor layer in the semiconductor layer forming step can be reduced, and a high quality semiconductor layer can be formed. Further, according to the method of repeating the gas replacement operation a plurality of times before forming the semiconductor layer, process time required for reducing impurities can be shortened, and manufacturing efficiency of the semiconductor layer can be improved. Therefore, according to the manufacturing method of the technology disclosed herein, productivity of the semiconductor layer can also be improved.

Examples of the impurities incorporated into the semiconductor layer include impurities incorporated from outside the reaction chamber when a substrate on which the semiconductor layer is to be formed is transferred into the reaction chamber. Further, in the case of successively forming thin film photoelectric conversion elements by the single chamber system, at the time of forming a first conductive layer, a constituent material of a second conductive layer of a previously formed thin film photoelectric conversion element adheres to an inner wall, electrodes, and the like inside the reaction chamber. Accordingly, incorporation of impurities released from the constituent material of the second conductive layer, in particular, impurities determining a conductivity type of the second conductive layer, into the first conductive layer becomes problematic. In the technology disclosed herein, however, the first conductive layer is formed after performing the gas replacement operation a plurality of times, and thus less impurities are incorporated. Thereby, a high quality semiconductor layer can be formed.

According to a semiconductor layer manufacturing apparatus of the technology disclosed herein, the cycle of the gas replacement operation composed of the replacement gas introducing step and the exhausting step can be repeated a plurality of times at the time of forming the semiconductor layer in the reaction chamber, and thus the concentration of impurity atoms that exist inside the reaction chamber can be efficiently reduced, and the concentration of impurities incorporated into the semiconductor layer formed thereafter can be reduced. Thereby, a high quality semiconductor layer can be formed. Since process time required for reducing impurities can be shortened by repeating the gas replacement operation a plurality of times, the technology disclosed herein is practical as a method used for mass production of semiconductor layers.

The effect of reducing the concentration of impurities achieved by the gas replacement operation becomes greater with an increase in a ratio between a pressure inside the reaction chamber after the replacement gas introducing step and a pressure inside the reaction chamber after the exhausting step. Even when the ratio is low, however, a good effect of reducing the concentration of impurities can be achieved by increasing the number of repeating the gas replacement operation. In a semiconductor layer manufacturing apparatus used to manufacture semiconductor devices such as a thin film photoelectric conversion element, a display, and the like, a reaction chamber has a larger volume to deal with an increase in the size of substrates. Further, since the apparatus is simplified to reduce apparatus cost, a gas exhausting portion having low exhausting capability is employed. Therefore, there is a tendency that a pressure attained inside the reaction chamber cannot be set low. In such an apparatus in which the pressure attained inside the reaction chamber is high, it takes a long period of time to increase the ratio described above, and thus it is not practical to increase the ratio described above. The manufacturing method of the technology disclosed herein, which increases the number of repeating the gas replacement operation, is useful in that the impurities removing step can be completed in a short period of time particularly in a large volume semiconductor layer manufacturing apparatus.

Hereinafter, a typical mode of the technology disclosed herein will be described with reference to the drawings. FIG. 1 is a schematic cross sectional view of a semiconductor layer manufacturing apparatus used in the technology disclosed herein. The semiconductor layer manufacturing apparatus used in the technology disclosed herein includes a reaction chamber capable of being hermetically sealed for forming a semiconductor layer therein, a gas introducing portion for introducing a replacement gas into the reaction chamber, and a gas exhausting portion for exhausting the replacement gas from the reaction chamber. The semiconductor layer manufacturing apparatus of FIG. 1 has a parallel plate type electrode structure in which a cathode electrode 102 and an anode electrode 103 are disposed inside a reaction chamber 101 capable of being hermetically sealed. A distance between cathode electrode 102 and anode electrode 103 is determined depending on desired processing conditions, and is generally set to several millimeters to several tens of millimeters. An electric power supplying portion 108 supplying electric power to cathode electrode 102, and an impedance matching circuit 105 matching impedances among electric power supplying portion 108, cathode electrode 102, and anode electrode 103 are disposed outside reaction chamber 101.

Electric power supplying portion 108 is connected to one end of an electric power introducing line 106*a*. The other end of electric power introducing line 10*a* is connected to impedance matching circuit 105. One end of an electric power introducing line 106*b* is connected to impedance matching circuit 105, and the other end of electric power introducing line 106*b* is connected to cathode electrode 102. Electric power supplying portion 108 may be the one outputting any of a CW (continuous waveform) alternating current (AC) output and a pulse-modulated (on/off controlled) AC output.

AC electric power output from electric power supplying portion 108 generally has a frequency of 13.56 MHz. However, the frequency is not limited thereto, and a frequency of several kHz to a frequency in the VHF band and further in the microwave band may be used.

On the other hand, anode electrode 103 is electrically grounded, and a substrate 107 having, for example, a transparent conductive film formed thereon is placed on anode electrode 103. Although substrate 107 may be placed on cathode electrode 102, it is generally placed on anode electrode 103 to reduce degradation in film quality due to ion damage in plasma.

Gas introducing portion 110 is provided in reaction chamber 101. A gas 118 such as a dilution gas, a material gas, a doping gas, or the like is introduced from gas introducing portion 110. Examples of the dilution gas include a gas containing hydrogen gas, and examples of the material gas include silane-based gas, methane gas, germane gas, and the like. Examples of the doping gas include p-type impurity doping gases such as diborane gas and the like, and n-type impurity doping gases such as phosphine gas and the like.

Further, a gas exhausting portion 116 and a pressure regulating valve 117 are connected in series to reaction chamber 101, and a gas pressure inside reaction chamber 101 is kept substantially constant. It is desirable to measure the gas pressure at a position away from gas introducing portion 110 and a gas exhaust port 119 in the reaction chamber, because a slight error is caused if the gas pressure is measured at a position close to gas introducing portion 110 and gas exhaust port 119. By supplying electric power to cathode electrode 102 in this state, it is possible to generate plasma between cathode electrode 102 and anode electrode 103, decompose gas 118, and form a semiconductor layer on substrate 107.

Gas exhausting portion 116 may be the one capable of exhausting gas to reduce the gas pressure inside reaction chamber 101 to a pressure of about $1.0\times10^{-4}$ Pa and achieving high vacuum. Desirably, gas exhausting portion 116 has the capability of exhausting gas to a pressure of about 0.1 Pa, from the viewpoint of simplification, cost reduction, and improved throughput of the apparatus. Reaction chamber 101 has a larger volume to deal with an increase in the size of substrates of semiconductor devices. To exhaust such reaction chamber 101 to achieve high vacuum, high performance gas exhausting portion 116 is required, which is not desirable from the viewpoint of simplification and cost reduction of the apparatus. It is more desirable to use simple gas exhausting portion 116 for low vacuum use.

Examples of simple gas exhausting portion 116 for low vacuum use include a rotary pump, a mechanical booster pump, a sorption pump, and the like, and it is preferable to use these pumps alone or in combination of two or more thereof.

Reaction chamber 101 of the semiconductor layer manufacturing apparatus used in the technology disclosed herein can have a size of; for example, about 1 m3. As typical gas exhausting portion 116, a mechanical booster pump and a rotary pump connected in series can be used. When exhaust is fully performed with this configuration, the pressure inside reaction chamber 101 has a vacuum degree of about 0.1 Pa. A vacuum pressure attained inside reaction chamber 101 is preferably greater than or equal to 0.1 Pa and less than or equal to 10000 Pa, more preferably greater than or equal to 0.1 Pa and less than or equal to 1000 Pa, and farther preferably greater than or equal to 0.1 Pa and less than or equal to 100 Pa.

Further, in such a case of giving priority to production efficiency of a semiconductor layer in particular, gas exhausting portion 116 capable of efficiently performing cycle purge at several hundred Pa may be provided.

The technology disclosed herein also provides a semiconductor device including a substrate, and a semiconductor layer and an electrode formed on the substrate. That is, the semiconductor layer manufactured by the technology disclosed herein can be used, for example, as a portion of a semiconductor device such as a thin film photoelectric conversion element.

EMBODIMENT 1

An example of the semiconductor layer manufacturing method in accordance with the technology disclosed herein will be described below with reference to the drawings. In the semiconductor layer manufacturing method of the technology disclosed herein, as a typical example a semiconductor layer including a plurality of layers having different conductivity types can be formed inside the same reaction chamber.

Figure 2:
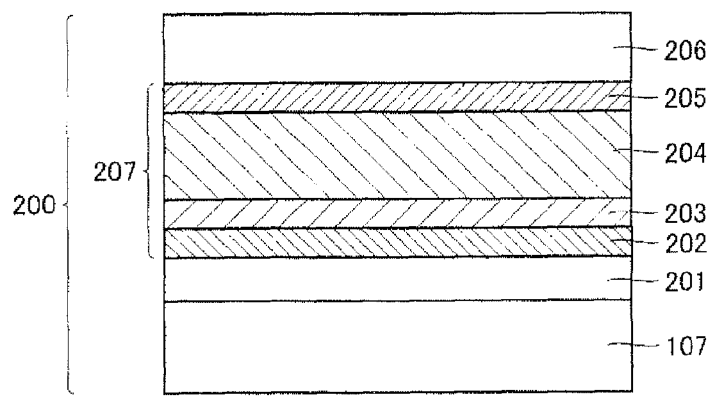
FIG. 2 is a schematic cross sectional view of a thin film photoelectric conversion element as a semiconductor device formed in Embodiment 1 of the technology disclosed herein.

FIG. 2 is a schematic cross sectional view of a thin film photoelectric conversion element as a semiconductor device formed in Embodiment 1 of the technology disclosed herein. A thin film photoelectric conversion element 200 shown in FIG. 2 has a structure including substrate 107, a first electrode 201, a semiconductor layer 207 having a first conductive layer 202, a buffer layer 203, a photoelectric conversion layer 204, and a second conductive layer 205, and a second electrode 206. In FIG. 2, the first conductive layer 202, buffer layer 203, photoelectric conversion layer 204, and the second conductive layer 205 correspond to semiconductor layer 207 manufactured in the technology disclosed herein, Semiconductor layer 207 of the thin film photoelectric conversion element is formed inside reaction chamber 101 for the single chamber system as shown for example in FIG. 1, for example by plasma CVD, thermal CVD, optical CVD, MOCVD, sputtering, or the like.

As a more concrete example of the semiconductor layer formed by the semiconductor layer manufacturing method of the technology disclosed herein, a semiconductor layer used in a photoelectric conversion element, including a p-type layer, an i-type layer, and an n-type layer can be illustrated. Such a semiconductor layer is formed, for example, by a semiconductor layer forming step including a first conductive layer forming step of forming a first conductive layer made of a p-type layer or an n-type layer, a photoelectric conversion layer forming step of forming a photoelectric conversion layer made of an i-type layer on the first conductive layer, and a second conductive layer forming step of forming a second conductive layer made of a p-type layer or an n-type layer on the photoelectric conversion layer.

In order to reduce diffusion of impurities determining a conductivity type of the first conductive layer into the photoelectric conversion layer, it is more desirable that the semiconductor layer forming step further includes a buffer layer forming step of forming a buffer layer made of an i-type layer, between the first conductive layer forming step and the photoelectric conversion layer forming step. This example will be described in the present embodiment.

Further, conductivity types of the first conductive layer and the second conductive layer are selected to be different from each other. Although a description will be given in the present embodiment on an exemplary case where the first conductive layer is a p-type layer and the second conductive layer is an n-type layer, the first conductive layer may be an n-type layer and the second conductive layer may be a p-type layer in the technology disclosed herein.

As substrate 107, a glass substrate or a substrate of resin such as polyimide or the like having resistance to heat in a plasma CVD forming process and light transmission property is generally used. In the present embodiment, a description will be given on an exemplary case where a glass substrate is used as substrate 107.

As the first electrode 201, a transparent conductive film of $SnO_2$, ITO, ZnO, or the like is used. These films are generally formed by a method such as CVD, sputtering, electron beam deposition, or the like. In the present embodiment, a description will be given on an exemplary case where $SnO_2$ is used as the first electrode 201.

In the present embodiment, the first conductive layer 202 is a boron-doped p-type amorphous silicon-based semiconductor layer, buffer layer 203 is an i-type amorphous silicon-based semiconductor layer, photoelectric conversion layer 204 is an i-type amorphous silicon semiconductor layer, and the second conductive layer 205 is an n-type silicon-based semiconductor layer. As a silicon-based semiconductor layer, for example, amorphous or microcrystalline silicon, silicon carbide, silicon germanium, or the like can be used. Further, as doping materials for conductive semiconductor layers, for example, boron, aluminum, or the like can be used for a p-type semiconductor layer, and phosphorus or the like can be used for an n-type semiconductor layer.

As the second electrode 206, a metal such as silver, aluminum, or the like, a transparent conductive film of $SnO_2$, ITO, ZnO, or the like, or a stacked combination thereof is used. These are formed by a method such as CVD, sputtering, electron beam deposition, or the like. In the present embodiment, a description will be given on an exemplary case where ZnO and silver stacked in this order by sputtering is used as the second electrode 206.

Figure 3:
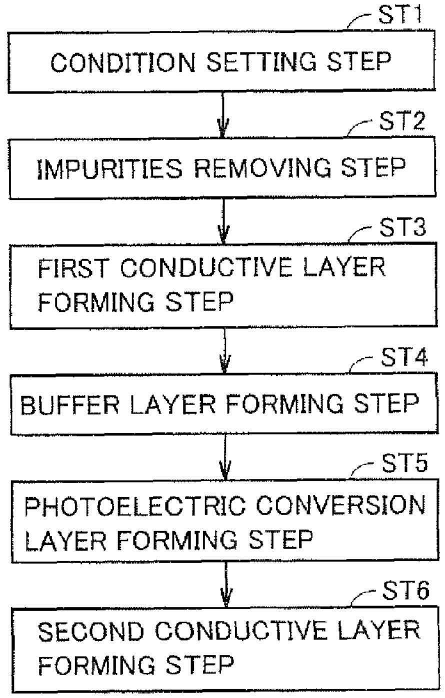
FIG. 3 is a flowchart of a semiconductor layer manufacturing method in accordance with Embodiment 1 of the technology disclosed herein.

FIG. 3 is a flowchart of a semiconductor layer manufacturing method in accordance with Embodiment 1 of the technology disclosed herein. In the present embodiment, a description will be given on a semiconductor layer manufacturing method including a condition setting step (ST1), an impurities removing step (ST2), and a semiconductor layer forming step having a first conductive layer forming step (ST3), a buffer layer forming step (ST4), a photoelectric conversion layer forming step (ST5), and a second conductive layer forming step (ST6).

[Condition Setting Step: ST1]

In the condition setting step, placement of a substrate, vacuum exhaust of the reaction chamber, and substrate temperature setting are performed. Firstly, substrate 107 is placed on anode electrode 103, and vacuum exhaust is performed until a background pressure inside reaction chamber 101 is reduced to about 0.1 Pa. Herein, the background pressure refers to a pressure inside the reaction chamber immediately before the semiconductor layer forming step. In order to enhance production efficiency of a semiconductor layer, the background pressure may be greater than 0.1 Pa. In the technology disclosed herein, the background pressure is preferably greater than or equal to 0.1 Pa and less than or equal to 10000 Pa, more preferably greater than or equal to 0.1 Pa and less than or equal to 1000 Pa, and further preferably greater than or equal to 0.1 Pa and less than or equal to 100 Pa. Further, the temperature of substrate 107 is preferably set at less than or equal to 250° C., and more preferably set at 140 to 200° C., to allow formation of a high quality semiconductor layer.

[Impurities Removing Step: ST2]

Next, as a replacement gas, for example, hydrogen gas is introduced into reaction chamber 101 (i.e., a replacement gas introducing step), and when the pressure inside reaction chamber 101 reaches about 100 Pa to 1000 Pa, introduction of hydrogen gas is stopped, and exhaust is performed until the pressure inside reaction chamber 101 is reduced to about 1 Pa to 10 Pa (i.e., an exhausting step). Herein, in the technology disclosed herein, cycle composed of the replacement gas introducing step and the exhausting step is also referred to as a gas replacement operation. In the technology disclosed herein, the gas replacement operation is repeated a plurality of times. Thereby, impurities can be efficiently removed The gas replacement operation is preferably repeated, for example, two to ten cycles, and more typically, it is preferably repeated, for example, four cycles.

Time required for one cycle of the gas replacement operation can be set to about several seconds to several tens of seconds. Specifically, it is possible to perform the replacement gas introducing step for one to five seconds, and perform the exhausting step for 30 to 60 seconds. Although one cycle of the as replacement operation is performed in such a short period of time, the gas replacement operation is repeated a plurality of times in the impurities removing step of the technology disclosed herein, and thus a concentration of impurities inside the reaction chamber can be fully reduced. Therefore, the semiconductor layer manufacturing method of the technology disclosed herein is also practical when it is applied to a mass production apparatus.

In the present embodiment, the first conductive layer 202, buffer layer 203, photoelectric conversion layer 204, and the second conductive layer 205 are formed after the gas replacement operation is repeated a plurality of times. Therefore, a concentration of impurities that exist in an atmosphere inside the reaction chamber immediately before forming the first conductive layer can be reduced, and a concentration of impurities incorporated into the semiconductor layer formed after the first conductive layer can be reduced. Examples of the impurities include impurities or the like in the air incorporated from outside the reaction chamber when substrate 107 is transferred into reaction chamber 101.

In the case of successively manufacturing thin film photoelectric conversion elements as shown in FIG. 2 by the single chamber system, at the time of forming the first conductive layer 202 of a semiconductor layer, a constituent material of the second conductive layer 205 of a thin film photoelectric conversion element manufactured before forming the semiconductor layer adheres to the inner wall, the electrodes, and the like inside the reaction chamber. Accordingly, incorporation of impurities released from the constituent material of the second conductive layer, in particular, impurities determining a conductivity type of the second conductive layer, into the first conductive layer 202 becomes problematic. The amount of impurities incorporated into the first conductive layer 202 can be reduced by forming the first conductive layer 202 after repeating the gas replacement operation a plurality of times as in the technology disclosed herein.

In the present embodiment, an operation can be performed such that, as a replacement gas, for example, hydrogen gas is introduced into reaction chamber 101 (i.e., the replacement gas introducing step), and when the pressure inside reaction chamber 101 reaches about 100 Pa to 1000 Pa, introduction of hydrogen gas is stopped, and exhaust is performed until the pressure inside reaction chamber 101 is reduced to about 1 Pa to 10 Pa (i.e., the exhausting step).

Preferably, in the technology disclosed herein, a pressure after introducing the replacement gas and a pressure after exhausting the replacement gas inside reaction chamber 101 are set beforehand, and in the replacement gas introducing step, exhaust from reaction chamber 101 is stopped, and when a pressure inside the reaction chamber is increased to greater than or equal to the pressure after introducing the replacement gas, introduction of the replacement gas is stopped and the replacement gas introducing step is terminated, and in the exhausting step, introduction of the replacement gas is stopped, and when the pressure inside reaction chamber 101 is reduced to less than or equal to the pressure after exhausting the replacement gas, exhaust is stopped and the exhausting step is terminated.

In the case of setting a prescribed pressure after introducing the replacement gas and a prescribed pressure after exhausting the replacement gas as described above, it is desirable to determine the number of repeating the gas replacement operation according to a condition described below. Specifically, it is preferable that an allowable concentration [N] (unit: atoms/$cm^3$) of impurity atoms inside reaction chamber 101 immediately before the semiconductor layer forming step is set beforehand, and a number n (unit: number of times) of the cycle satisfies the following expression:

$$[N]_o \times (M/m)^n \leqq [N],$$

where $[N]_o$ (unit: atoms/$cm^3$) represents a concentration of impurity atoms inside the reaction chamber before starting the cycle, m (unit: Pa) represents the pressure after introducing the replacement gas, and M (unit: Pa) represents the pressure after exhausting the replacement gas.

In the present embodiment, at the time of forming the first conductive layer 202 in the semiconductor layer forming step, the allowable concentration [N] of impurity atoms inside reaction chamber 101 before forming the first conductive layer 202 that is allowable to maintain film quality is set such that, in the case of a silicon-based semiconductor layer, a concentration of oxygen atoms is about $5.0\times10^{19}$ atoms/$cm^3$ and a concentration of nitrogen atoms is about $1.0\times10^{18}$ atoms/$cm^3$, For example, when the concentration $[N]_o$ of oxygen atoms and the concentration $[N]_o$ of nitrogen atoms inside reaction chamber 101 at the time of starting the gas replacement operation are $1.0\times10^{22}$ atoms/$cm^3$ and $2.0\times10^{22}$ atoms/$cm^3$, respectively, pressure In after introducing the replacement gas is 100 Pa, and pressure M after exhausting the replacement gas is 10 Pa, the gas replacement operation should be performed at least four times, as number n of repetition, to cause the concentration of nitrogen atoms to be less than or equal to the allowable concentration of impurity atoms (i.e., $1.0\times10^{18}$ atoms/$cm^3$).

By increasing the number of repeating the gas replacement operation, and by reducing a ratio between pressure M after exhausting the replacement gas and pressure in after introducing the replacement gas (M/m), the concentration of impurities that exist in reaction chamber 101 can be further reduced. In this case, less impurities are incorporated into a semiconductor layer formed thereafter, improving the film quality of the formed semiconductor layer.

Further, although the description has been given in the present embodiment on the exemplary case where hydrogen gas is used as a replacement gas, at least any of gases used to form an i-type layer may be used. Furthermore, silane gas may be used as a replacement gas. The gases used to form an i-type layer are used to form any of p-type, i-type, and n-type semiconductor layers. Accordingly, it is preferable to use a gas used to form an i-type layer as a replacement gas, because no impurities are incorporated from the gas into the semiconductor layer.

Further, in the technology disclosed herein, an inert gas or the like not affecting the film quality of the semiconductor layer may be used as a replacement gas. In particular, a gas having a large atomic weight is likely to remain inside reaction chamber 101 when exhaust is performed in reaction chamber 101, and thus it is suitable as a replacement gas. Examples of inert gases include argon gas, neon gas, xenon gas, and the like.

[First Conductive Layer Forming Step: ST3]

In the present embodiment, after the impurities removing step, a p-type amorphous silicon-based semiconductor layer is formed as the first conductive layer 202. Firstly, vacuum exhaust is performed to reduce the background pressure inside reaction chamber 101 to about 0.1 Pa. Subsequently, a mixed gas is introduced into reaction chamber 101, and the pressure inside reaction chamber 101 is kept substantially constant by pressure regulating valve 117. The pressure inside reaction chamber 101 is set to, for example, greater than or equal to 200 Pa and less than or equal to 3000 Pa. As the mixed gas introduced into reaction chamber 101, for example, a gas containing silane gas, hydrogen gas, and diborane gas can be used. A flow rate of the hydrogen gas is desirably about several times to several tens of times that of the silane gas, and can be set to 10 times in the present embodiment.

After the pressure inside reaction chamber 101 is stabilized, an AC power of several kHz to 80 MHz is supplied to cathode electrode 102 to generate plasma between cathode electrode 102 and anode electrode 103, and a p-type amorphous silicon-based semiconductor layer as the first conductive layer 202 is formed. An electric power density per unit area of cathode electrode 102 can be set to greater than or equal to 0.01 W/cm$^2$ and less than or equal to 0.3 W/cm$^2$.

After the p-type amorphous silicon-based semiconductor layer with a desired thickness is formed as described above, supply of the AC power is stopped, and vacuum exhaust of reaction chamber 101 is performed.

The thickness of the p-type amorphous silicon-based semiconductor layer as the first conductive layer 202 is preferably greater than or equal to 2 nm, and more preferably greater than or equal to 5 nm, in terms of supplying a satisfactory internal electric field to photoelectric conversion layer 204 made of an i-type amorphous silicon-based semiconductor layer. Further, the thickness of the p-type amorphous silicon-based semiconductor layer as the first conductive layer 202 is preferably less than or equal to 50 nm, and more preferably less than or equal to 30 nm, in terms of necessity for suppressing the amount of light absorption on a light incident side of an inactive layer.

[Buffer Layer Forming Step: ST4]

Next, an i-type amorphous silicon-based semiconductor layer is formed as buffer layer 203. Firstly, vacuum exhaust is performed to reduce the background pressure inside reaction chamber 101 to about 0.1 Pa. Subsequently, a mixed gas is introduced into reaction chamber 101, and the pressure inside reaction chamber 101 is kept substantially constant by pressure regulating valve 117. The pressure inside reaction chamber 101 is set to, for example, greater than or equal to 200 Pa and less than or equal to 3000 Pa. As the mixed gas introduced into reaction chamber 101, for example, a gas containing silane gas and hydrogen gas can be used. A flow rate of the hydrogen gas is desirably about several times to several tens of times that of the silane gas, and is set to 20 times in the present embodiment.

After the pressure inside reaction chamber 101 is stabilized, an AC power of several kHz to 80 MHz is supplied to cathode electrode 102 to generate plasma between cathode electrode 102 and anode electrode 103, and an i-type amorphous silicon-based semiconductor layer as buffer layer 203 is formed. An electric power density per unit area of cathode electrode 102 can be set to greater than or equal to 0.01 W/cm$^2$ and less than or equal to 0.3 W/cm$^2$.

After the i-type amorphous silicon-based semiconductor layer with a desired thickness is formed as described above, supply of the AC power is stopped, and vacuum exhaust of reaction chamber 101 is performed.

Herein, the i-type amorphous silicon-based semiconductor layer as buffer layer 203 can reduce a concentration of boron atoms in the atmosphere inside reaction chamber 101, and reduce boron atoms incorporated into an i-type amorphous silicon semiconductor layer as photoelectric conversion layer 204 formed subsequently.

The thickness of the i-type amorphous silicon-based semiconductor layer as buffer layer 203 is desirably greater than or equal to 2 nm to suppress diffusion of boron atoms from the p-type amorphous silicon-based semiconductor layer as the first conductive layer 202 to photoelectric conversion layer 204. On the other hand, the thickness is desirably as small as possible to suppress the amount of light absorption and increase light reaching photoelectric conversion layer 204. The thickness of buffer layer 203 is generally set to less than or equal to 50 nm. In the present embodiment, the i-type amorphous silicon-based semiconductor layer as buffer layer 203 has a thickness of 20 nm.

[Photoelectric Conversion Layer Forming Step: ST5]

Next, an i-type amorphous silicon semiconductor layer is formed as photoelectric conversion layer 204. Firstly, vacuum exhaust is performed to reduce the background pressure inside reaction chamber 101 to about 0.1 Pa. Subsequently, a mixed gas is introduced into reaction chamber 101, and the pressure inside reaction chamber 101 is kept substantially constant by pressure regulating valve 117. The pressure inside reaction chamber 101 is set to, for example, greater than or equal to 200 Pa and less than or equal to 3000 Pa. As the mixed gas introduced into reaction chamber 101, for example, a gas containing silane gas and hydrogen gas can be used. A flow rate of the hydrogen gas is preferably greater than or equal to five times and less than or equal to 20 times that of the silane gas, and in this case, an i-type amorphous silicon layer with good film quality can be formed. In the present embodiment, the flow rate of the hydrogen gas is set to 10 times that of the silane gas.

After the pressure inside reaction chamber 101 is stabilized, an AC power of several kHz to 80 MHz is supplied to cathode electrode 102 to generate plasma between cathode electrode 102 and anode electrode 103, and an i-type amorphous silicon semiconductor layer as photoelectric conversion layer 204 is formed. An electric power density per unit area of cathode electrode 102 can be set to greater than or equal to 0.01 W/cm$^2$ and less than or equal to 0.3 W/cm$^2$.

After the i-type amorphous silicon semiconductor layer with a desired thickness is formed as described above, supply of the AC power is stopped, and vacuum exhaust of reaction chamber 101 is performed.

The thickness of the i-type amorphous silicon semiconductor layer as photoelectric conversion layer 204 is preferably set to a value ranging from 0.1 μm to 0.5 μm in consideration of the amount of light absorption and deterioration in photoelectric conversion property due to light degradation. In the present embodiment, the i-type amorphous silicon semiconductor layer has a thickness of 0.3 μm.

[Second Conductive Layer Forming Step: ST6]

Next, an n-type amorphous or crystalline silicon-based semiconductor layer is formed as the second conductive layer 205. Firstly, vacuum exhaust is performed to reduce the background pressure inside reaction chamber 101 to about 0.1 Pa. Subsequently, a mixed gas is introduced into reaction chamber 101, and the pressure inside reaction chamber 101 is kept substantially constant by pressure regulating valve 117. The pressure inside reaction chamber 101 is set to, for example, greater than or equal to 200 Pa and less than or equal to less than or equal to 3000 Pa. As the mixed gas introduced into reaction chamber 101, for example, a gas containing silane gas, hydrogen gas, and phosphine gas can be used. A flow rate of the hydrogen gas is preferably greater than or equal to five times and less than or equal to 200 times that of the silane gas.

After the pressure inside reaction chamber 101 is stabilized, an AC power of several kHz to 80 MHz is supplied to cathode electrode 102 to generate plasma between cathode electrode 102 and anode electrode 103, and an n-type amorphous or crystalline silicon-based semiconductor layer as the second conductive layer 205 is formed. An electric power density per unit area of cathode electrode 102 can be set to greater than or equal to 0.01 W/cm$^2$ and less than or equal to 0.3 W/cm$^2$.

The thickness of the n-type silicon-based semiconductor layer as the second conductive layer 205 is preferably greater than or equal to 2 nm to supply a satisfactory internal electric field to the i-type amorphous silicon-based semiconductor layer as photoelectric conversion layer 204. On the other hand, the thickness is preferably as small as possible to suppress the amount of light absorption of the n-type silicon-based semiconductor layer as an inactive layer, and is generally set to less than or equal to 50 nm. In the present embodiment, the n-type silicon-based semiconductor layer as the second conductive layer 205 has a thickness of 30 nm. Thus, an amorphous silicon-based semiconductor layer can be formed.

Although the description has been given in the present embodiment on the exemplary case where photoelectric conversion layer 204 is an i-type amorphous silicon-based semiconductor layer, the technology disclosed herein is also applicable to a case where photoelectric conversion layer 204 is, for example, an i-type microcrystalline silicon-based semiconductor layer.

The semiconductor layer manufacturing method of technology disclosed herein, in which the gas replacement operation is repeated a plurality of times, produces an excellent effect particularly when the degree of vacuum inside reaction chamber 101 cannot be set low, such as when gas exhausting portion 116 having low exhaust capability is employed to simplify a semiconductor layer manufacturing apparatus, when reaction chamber 101 has a large volume, and the like. In the present embodiment, since the background pressure inside reaction chamber 101 is greater than or equal to 0.1 Pa and thus reaction chamber 101 is in a low vacuum state, it is impossible to reduce the concentration of impurities that exist in reaction chamber 101, when compared with a case where high vacuum exhaust of reaction chamber 101 is performed in the technology disclosed herein, however, the concentration of impurities inside reaction chamber 101 immediately before the semiconductor layer forming step can be reduced by repeatedly performing the gas replacement operation a plurality of times. Thereby, impurities incorporated into a semiconductor layer formed in a subsequent step can be reduced, improving the film quality of the formed semiconductor layer. Therefore, in a case where the semiconductor layer formed in the present embodiment is used in a thin film photoelectric conversion element, the thin film photoelectric conversion element can have an improved photoelectric conversion property.

As the semiconductor layer formed in the technology disclosed herein, a silicon-based alloy or other materials can be employed, in addition to the silicon layer described in the present embodiment. Further, a crystalline semiconductor layer having a crystal structure may be formed. Although the description has been given in the present embodiment on the case where a silicon-based semiconductor layer is formed as the semiconductor layer for example by plasma CVD, the technology disclosed herein is not limited thereto.

In the first conductive layer forming step (ST3), the buffer layer forming step (ST4), the photoelectric conversion layer forming step (ST5), and the second conductive layer forming step (ST6) of the present embodiment, the pressure inside reaction chamber 101 at the time of forming the respective layers is set to greater than or equal to 200 Pa and less than or equal to 3000 Pa, and the electric power density is set to greater than or equal to 0.01 W/cm$^2$ and less than or equal to 0.3 W/cm$^2$, as described above. Herein, the formation condition that a film forming pressure is greater than or equal to 200 Pa is a pressure condition in a range higher than the condition conventionally employed to form an amorphous silicon-based semiconductor layer.

In the case of successively manufacturing thin film photoelectric conversion elements by the single chamber system, before forming the first conductive layer and the photoelectric conversion layer, n-type impurities released from an n-type amorphous or crystalline silicon-based semiconductor layer as the second conductive layer of a previously manufactured thin film photoelectric conversion element adhere to the electrodes inside the reaction chamber. By forming a p-type amorphous silicon-based semiconductor layer as the first conductive layer 202 and an i-type amorphous silicon semiconductor layer as photoelectric conversion layer 204 under a relatively high pressure of greater than or equal to 200 Pa, a mean free path in the n-type silicon-based semiconductor layer (i.e., a movable distance inside the reaction chamber) can be reduced, In this case, the amount of n-type impurities incorporated into the p-type first conductive layer and the i-type photoelectric conversion layer can be reduced.

Further, by forming the p-type amorphous silicon-based semiconductor layer as the first conductive layer 202 and the i-type amorphous silicon-based semiconductor layer as photoelectric conversion layer 204 under a film forming pressure of less than or equal to 3000 Pa, a silicon-based semiconductor thin film with good film quality can be formed for use in a thin film photoelectric conversion element.

Furthermore, by forming the first conductive layer 202 and photoelectric conversion layer 204 with a low electric power density per unit area of the electrode such as less than or equal to 0.3 W/cm$^2$, energy of electrons and ions in plasma that impinge on the electrode can be reduced. Since n-type impurities are discharged from the n-type amorphous or crystalline silicon-based semiconductor adhering to the cathode electrode or the anode electrode as electrons and ions in plasma impinge on the electrode, the amount of n-type impurities incorporated into the first conductive layer 202 and photoelectric conversion layer 204 to be formed can be reduced by reducing the energy of the electrons and ions. Further, by forming the first conductive layer 202 and photoelectric conversion layer 204 under the formation condition that the electric power density is greater than or equal to 0.01 W/cm$^2$, a silicon-based semiconductor thin film with good film quality can be formed for use in a thin film photoelectric conversion element.

Although the second conductive layer 205 may be any of an amorphous semiconductor and a crystalline semiconductor in the present embodiment, it is desirably a crystalline semiconductor. Since doping efficiency for n-type impurity atoms is high in a crystal portion, the second conductive layer 205 can have a desired conductivity by containing a crystal portion, without increasing a concentration of n-type impurity atoms. Therefore, a concentration of n-type impurities in the second conductive layer 205 can be reduced, and thus diffusion of n-type impurities to other layers can be reduced.

The formation conditions for the respective semiconductor layers in the manufacturing method of the technology disclosed herein are not limited to those described in the embodiment. Also when the semiconductor layer is formed under other formation conditions, the concentration of impurities incorporated into the semiconductor layer can be reduced by repeating the gas replacement operation a plurality of times in the impurities removing step, and thus a semiconductor layer with good film quality can be formed.

In the present embodiment, the semiconductor layer is formed with the method described above, and thereafter the second electrode 206 is formed by forming a conductive film of such as ITO, ZnO, or the like and a metal film of such as aluminum, silver, or the like by sputtering, deposition, or the like. Thereby, thin film photoelectric conversion element 200 having a silicon-based semiconductor layer can be manufactured.

EMBODIMENT 2

Figure 4:
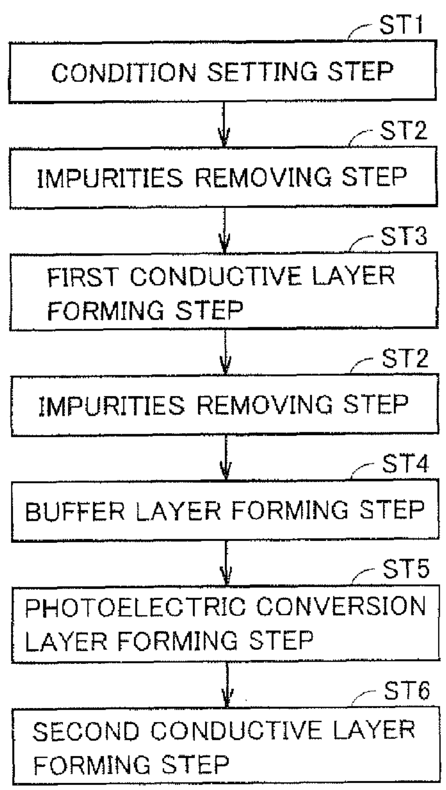
FIG. 4 is a flowchart of a semiconductor layer manufacturing method in accordance with Embodiment 2 of the technology disclosed herein.

FIG. 4 is a flowchart of a semiconductor layer manufacturing method in accordance with Embodiment 2 of the technology disclosed herein. In the present embodiment, a description will be given on a case where a semiconductor layer of a thin film photoelectric conversion element with a configuration shown in FIG. 2 is manufactured. In the technology disclosed herein, it is preferable to further include the impurities removing step between the first conductive layer forming step and the buffer layer forming step. In the present embodiment, a description will be given on a case where the impurities removing step (ST2) is further performed after the first conductive layer forming step (ST3) and before the buffer layer forming step (ST4). Since other steps can be performed as in Embodiment 1, the description thereof will not be repeated.

In the impurities removing step (ST2) performed after the first conductive layer forming step (ST3), the gas replacement operation can be repeatedly performed four times, as in the impurities removing step (ST2) performed before the first conductive layer forming step (ST3). The number of repetition is determined in consideration of a concentration of boron as impurities released, from the p-type amorphous silicon-based semiconductor as a constituent material of the first conductive layer 202 adhering to the inner wall, cathode electrode 102, and anode electrode 103 inside reaction chamber 101, to the inside of reaction chamber 101.

For example, when the first conductive layer 202 has a concentration of boron atoms of $1.0\times10^{20}$ to $1.0\times10^{21}$ atoms/$cm^3$ and photoelectric conversion layer 204 has a concentration of boron atoms of less than or equal to $1.0\times10^{17}$ atoms/$cm^3$, it is necessary to reduce the concentration of boron impurities by four orders of magnitude.

An allowable concentration [N] of impurity (i.e., boron in the present embodiment) atoms inside reaction chamber 101 before forming the i-type amorphous silicon semiconductor layer as photoelectric conversion layer 204 is less than or equal to $1.0\times10^{17}$ atoms/$cm^3$, and in a case where a concentration $[N]_o$ of impurity atoms inside reaction chamber 101 before starting the cycle of the gas replacement operation in the impurities removing step is $1.0\times10^{21}$ atoms/$cm^3$, pressure m after introducing the replacement gas is 100 Pa, and pressure M after exhausting the replacement gas is 10 Pa, it is necessary to mach the concentration of boron atoms with the allowable concentration of impurity atoms ($1.0\times10^{17}$ atoms/$cm^3$), and the gas replacement operation should be performed at least four times, as number n of repetition, to satisfy the expression $[N]_o\times(M/m)^n\leqq[N]$.

By performing the impurities removing step after forming the first conductive layer 202 and before forming buffer layer 203, the concentration of boron as impurities in the p-type silicon-based semiconductor that exist inside reaction chamber 101 can be reduced, and the concentration of impurities incorporated into the semiconductor layer formed after buffer layer 203 can be reduced. Thereby, the deterioration in the photoelectric conversion property of the thin film photoelectric conversion element can be further reduced even in a case where the semiconductor layer is formed by the single chamber system. Further, since the gas replacement operation is also repeatedly performed a plurality of times in the present embodiment, process time required for reducing the concentration of impurities inside reaction chamber 101 can be shortened. Therefore, the method of the present embodiment can be used as a practical method for mass production.

EMBODIMENT 3

Figure 5:
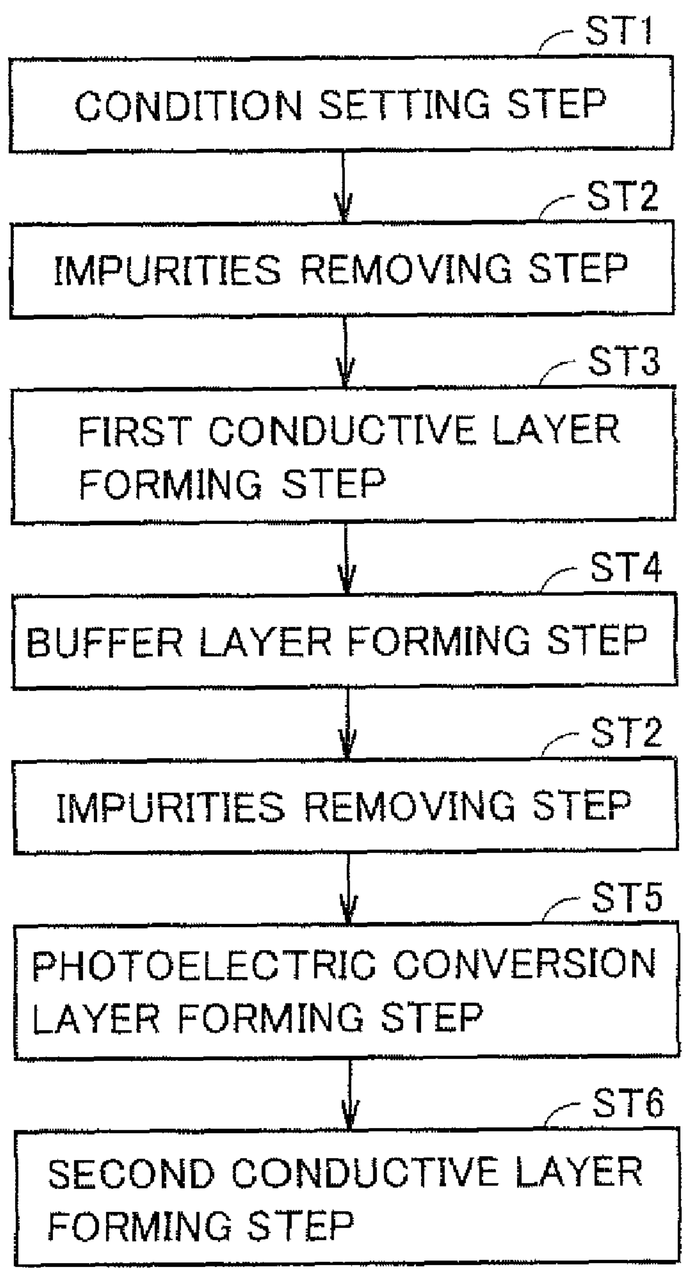
FIG. 5 is a flowchart of a semiconductor layer manufacturing method in accordance with Embodiment 3 of the technology disclosed herein.

FIG. 5 is a flowchart of a semiconductor layer manufacturing method in accordance with Embodiment 3 of the technology disclosed herein. In the present embodiment, a description will be given on a case where a semiconductor layer of a thin film photoelectric conversion element with a configuration shown in FIG. 2 is manufactured. In the technology disclosed herein, it is preferable to further include the impurities removing step between the buffer layer forming step and the photoelectric conversion layer forming step. In the present embodiment, a description will be given on a case where the impurities removing step (ST2) is further performed after the buffer layer forming step (ST4) and before the photoelectric conversion layer forming step (ST5). Since other steps can be performed as in Embodiment 1, the description thereof will not be repeated. The number of repeating the gas replacement operation in the impurities removing step is determined as in Embodiment 2, and is set to four times.

By performing the impurities removing step after forming buffer layer 203, the concentration of boron atoms as impurities in the p-type silicon-based semiconductor in the atmosphere inside reaction chamber 101 can be further reduced. This effect is considered to be produced because buffer layer 203 covers p-type impurities adhering to cathode electrode 102, anode electrode 103, and the inside of reaction chamber 101 at the time of forming the p-type silicon-based semiconductor layer, and thus the concentration of boron atoms released from the p-type impurities adhering as described above is reduced. Thereby, the effect of reducing the concentration of impurities produced by the impurities removing step performed after the buffer layer forming step is considered to be further enhanced. For the reason described above, the amount of impurities incorporated into photoelectric conversion layer 204 can be further reduced, and the deterioration in the photoelectric conversion property of the thin film photoelectric conversion element can be further successfully reduced.

EMBODIMENT 4

Figure 6:
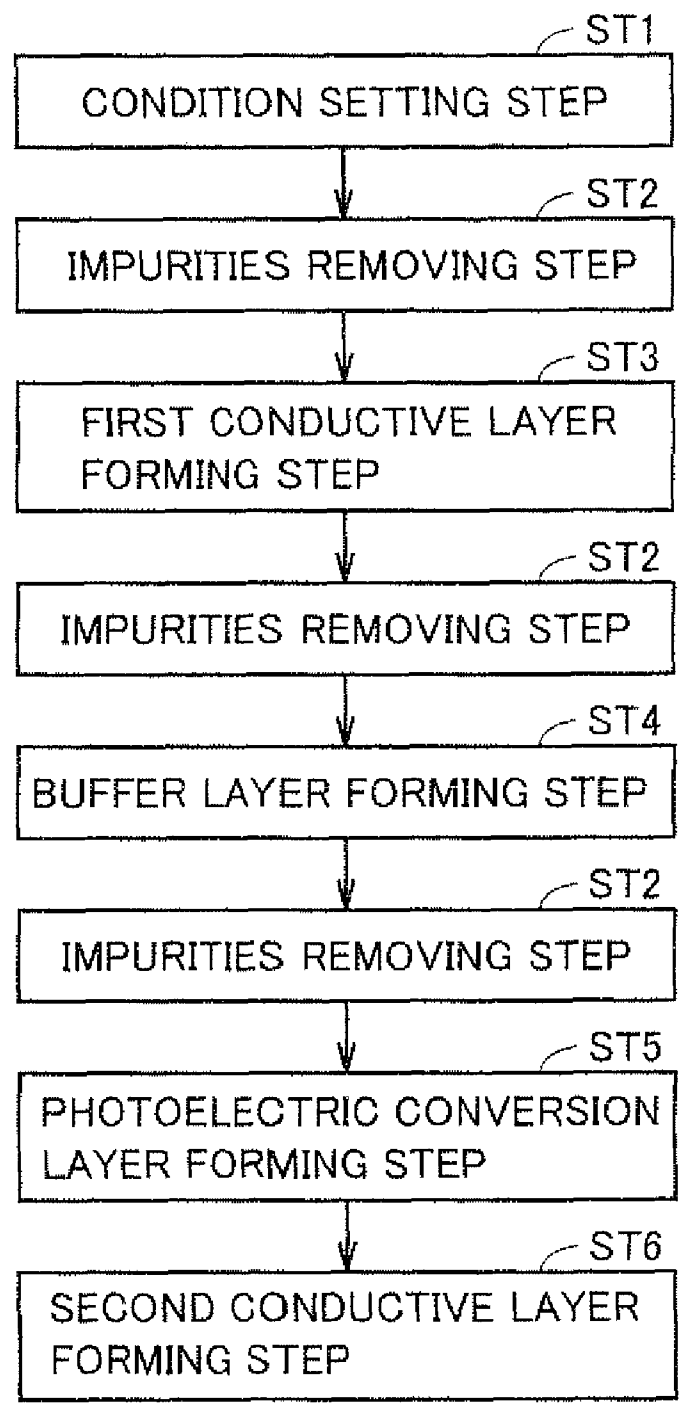
FIG. 6 is a flowchart of a semiconductor layer manufacturing method in accordance with Embodiment 4 of the technology disclosed herein.

FIG. 6 is a flowchart of a semiconductor layer manufacturing method in accordance with Embodiment 4 of the technology disclosed herein. In the present embodiment, a description will be given on a case where a semiconductor layer of a thin film photoelectric conversion element with a configuration shown in FIG. 2 is manufactured, The present embodiment is identical to Embodiment 3 except for further performing an impurities removing step (ST2) after the first conductive layer forming step (ST3) and before the buffer layer forming step (ST4). The number of repeating the gas replacement operation in each of the impurities removing steps (ST2) shown in FIG. 6 is determined as in Embodiment 2, and can be set to four times.

According to the semiconductor layer manufacturing method in accordance with the present embodiment, by performing the impurities removing step after forming the p-type silicon-based semiconductor layer as the first conductive layer 202 and before forming buffer layer 203 as in Embodiment 2, the concentration of boron as impurities in the p-type silicon-based semiconductor layer that exist inside reaction chamber 101 can be reduced. Further, by performing the impurities removing step again after forming buffer layer 203, the concentration of boron atoms as impurities in the p-type silicon-based semiconductor layer inside reaction chamber 101 can be further reduced. Thereby, the amount of impurities incorporated into photoelectric conversion layer 204 can be further reduced, and the deterioration in the photoelectric conversion property of the thin film photoelectric conversion element can be further successfully reduced.

EMBODIMENT 5

Figure 7:
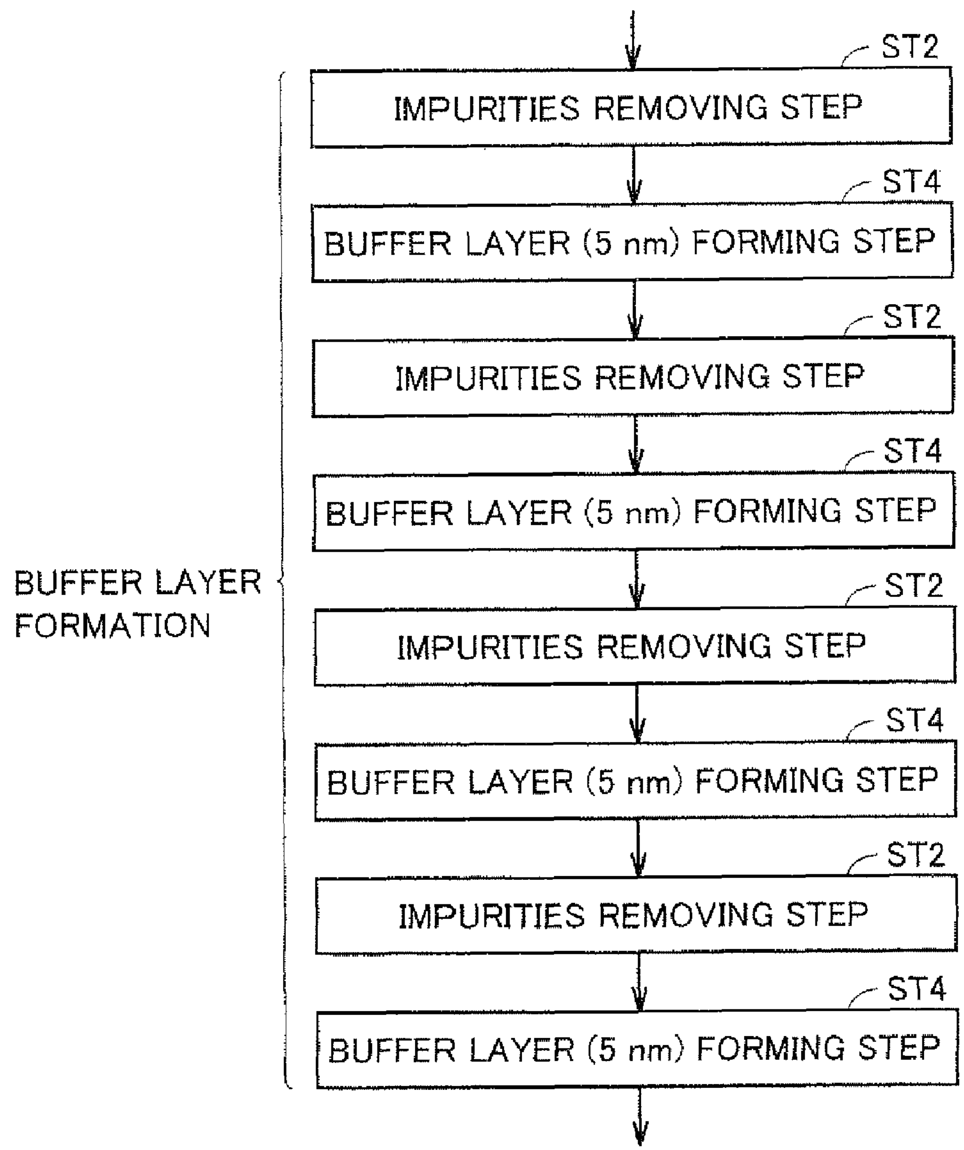
FIG. 7 is a flowchart of a method of forming a buffer layer in Embodiment 5 of the technology disclosed herein.

FIG. 7 is a flowchart of a method of forming a buffer layer in Embodiment 5 of the technology disclosed herein. In the present embodiment, a semiconductor layer including a p-type amorphous silicon-based semiconductor layer as the first conductive layer 202, an i-type amorphous silicon-based semiconductor layer as buffer layer 203, an i-type amorphous silicon layer as photoelectric conversion layer 204, and an n-type silicon-based semiconductor layer as the second conductive layer 205 is formed on substrate 107 by plasma CVD in the same reaction chamber 101, as a semiconductor layer of a thin film amorphous silicon photoelectric conversion element, as in Embodiment 2. In the method of the present embodiment, a method of forming buffer layer 203 made of an i-type amorphous silicon-based semiconductor layer is different from that of Embodiment 2.

In the semiconductor layer manufacturing method of the technology disclosed herein, it is preferable that the buffer layer includes a plurality of layers, and the impurities removing step is further performed after each buffer layer is formed in the buffer layer forming step. The method of forming the buffer layer that is different from that of Embodiment 2 will be described with reference to the drawing. In the present embodiment, buffer layer 203 is formed by repeating the impurities removing step (ST2) and the buffer layer forming step (ST4) of Embodiment 2 a plurality of times. That is, in the present embodiment, buffer layer 203 is formed as a plurality of layers. Firstly, the impurities removing step (ST2) as in Embodiment 2 is performed, and thereafter, a buffer layer made of a 5 nm-thick i-type amorphous silicon-based semiconductor layer is formed by the buffer layer (5 nm) forming step (ST4). By repeating a cycle composed of the impurities removing step (ST2) and the buffer layer (5 nm) forming step (ST4) four times, buffer layer 203 made of a 20 nm-thick i-type amorphous silicon-based semiconductor layer is formed. The number of repeating the gas replacement operation in each of the impurities removing steps is determined as in Embodiment 2, and is set to four times.

By forming buffer layer 203 in a plurality of steps with the impurity removing step interposed therebetween as described above, impurities incorporated into buffer layer 203 and the semiconductor layer formed thereafter can be further reduced, and the deterioration in the photoelectric conversion property of the thin film photoelectric conversion element can be further successfully reduced.

When the buffer layer is formed in a plurality of steps as in the present embodiment, the composition of the plurality of i-type amorphous silicon-based semiconductor layers constituting the buffer layer may be configured such that an optical bandgap is gradually narrowed toward photoelectric conversion layer 204. The bandgap is narrowed with a decrease in the amounts of hydrogen, carbon, oxygen, and the like in the i-type amorphous silicon-based semiconductor layer, and bandgap discontinuity between the first conductive layer 202 made of a p-type amorphous silicon-based semiconductor layer and photoelectric conversion layer 204 made of an i-type amorphous silicon layer can be relieved in buffer layer 203 made of i-type amorphous silicon-based semiconductor layers. Thereby, the photoelectric conversion property of the thin film photoelectric conversion element can be further successfully improved.

EMBODIMENT 6

Figure 8:
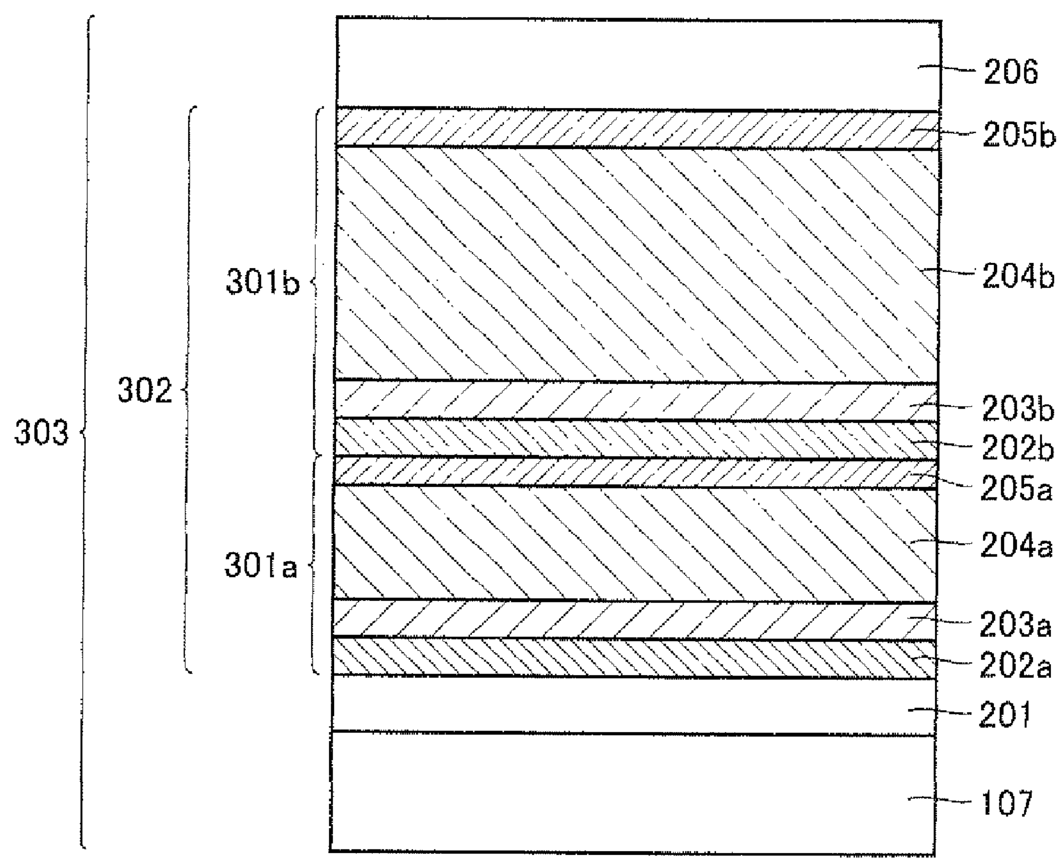
FIG. 8 is a schematic cross sectional view of a thin film photoelectric conversion element as a semiconductor device formed in Embodiment 6 of the technology disclosed herein.

FIG. 8 is a schematic cross sectional view of a thin film photoelectric conversion element as a semiconductor device formed in Embodiment 6 of the technology disclosed herein. In the present embodiment, a description will be given on a case where a semiconductor layer of a thin film photoelectric conversion element with a configuration shown in FIG. 8 is manufactured. It is to be noted that constituent materials for the semiconductor layer formed in the present embodiment are the same as those in Embodiment 1.

In the semiconductor layer manufacturing method of the technology disclosed herein, it is preferable that the semiconductor layer is made of a stack body of a plurality of pin semiconductors. In the present embodiment, the impurities removing step, the first conductive layer forming step, the buffer layer forming step, the photoelectric conversion layer forming step, and the second conductive layer forming step are performed twice in this order. That is, in the present embodiment, a description will be given on a case where a semiconductor layer of a thin film silicon-based photoelectric conversion element having a double pin structure stack body is formed on substrate 107 by plasma CVD, by the single chamber system, using a semiconductor layer manufacturing apparatus as shown in FIG. 1.

In FIG. 8, the first electrode 201 is formed on substrate 107, and a first pin structure stack body 301*a* formed by successively stacking a first conductive layer 202*a* as a p-type semiconductor layer, a buffer layer 203*a*, a photoelectric conversion layer 204*a*, and a second conductive layer 205*a* as an n-type semiconductor layer is formed on the first electrode 201. Subsequently, a second pin structure stack body 301*b* formed by successively stacking a first conductive layer 202*b* as a p-type semiconductor layer, a buffer layer 203*b*, a photoelectric conversion layer 204*b*, and a second conductive layer 205*b* as an n-type semiconductor layer is formed.

The first pin structure stack body 301*a* and the second pin structure stack body 301*b* constitute a double pin structure stack body 302, and the second electrode 206 is formed on double pin structure stack body 302. Thereby, a thin film photoelectric conversion element 303 is completed. It is to be noted that the materials and configurations of substrate 107, the first electrode 201, and the second electrode 206 can be identical to those of Embodiment 1.

Figure 9:
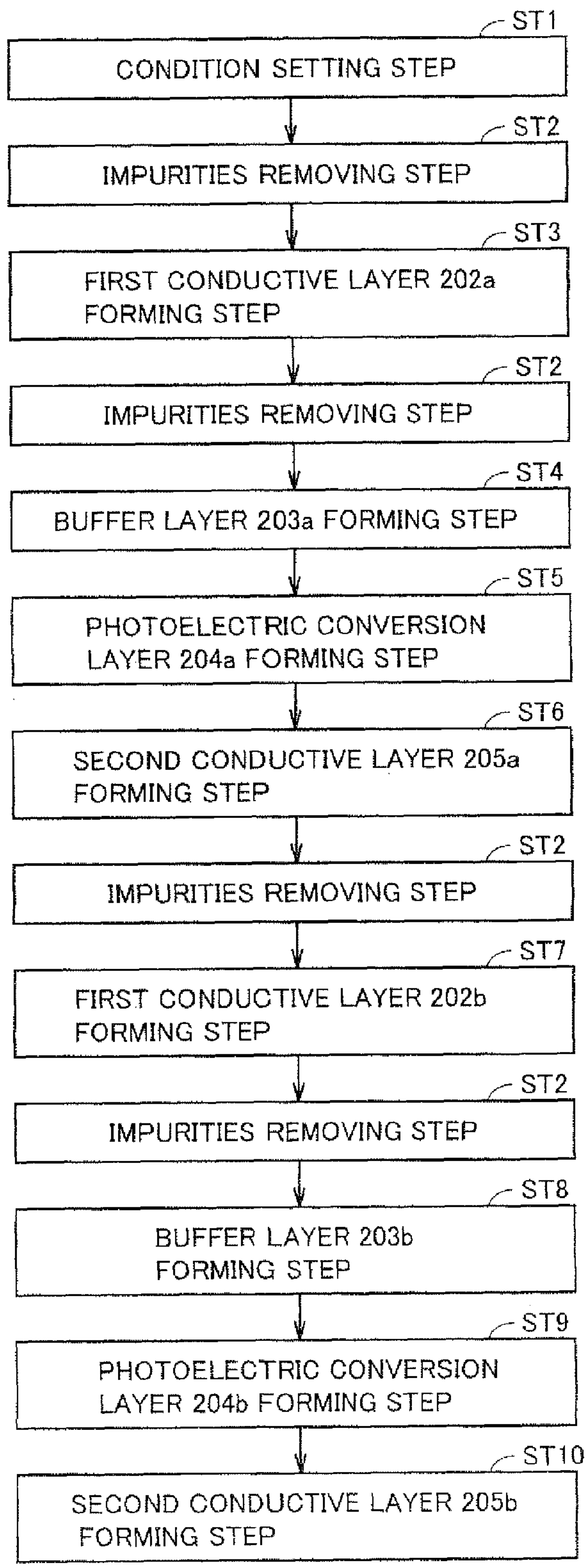
FIG. 9 is a flowchart of a semiconductor layer manufacturing method in accordance with Embodiment 6 of the technology disclosed herein.

FIG. 9 is a flowchart of a semiconductor layer manufacturing method in accordance with Embodiment 6 of the technology disclosed herein. In the present embodiment, after a condition setting step (ST1) and an impurities removing step (ST2), the first pin structure stack body 301*a* is formed by a method as in Embodiment 2 by performing a first conductive layer 202*a* forming step (ST3), an impurities removing step (ST2), a buffer layer 203*a* forming step (ST4), a photoelectric conversion layer 204*a* forming step (ST5), and a second conductive layer 205*a* forming step (ST6), and further, the second pin structure stack body 301*b* is formed by the method as in Embodiment 2 by performing an impurities removing step (ST2), a first conductive layer 202*b* forming step (ST7), an impurities removing step (ST2), a buffer layer 203*b* forming step (ST8), a photoelectric conversion layer 204*b* forming step (ST9), and a second conductive layer 205*b* forming step (ST10). In the present embodiment, photoelectric conversion layer 204*a* has a thickness of 0.07 μm, and photoelectric conversion layer 204*b* has a thickness of 0.3 μm.

In the present embodiment, by performing the impurities removing step (ST2) after forming the first pin structure stack body 301*a* and before forming the second pin structure stack body 301*b*, the amount of phosphorus atoms as impurities in the second conductive layer 205*a* incorporated into the first conductive layer 202*b* can be reduced. Thereby, even when the thin film photoelectric conversion element is formed by the single chamber system, the degradation in film quality of the second pin structure stack body 301*b* can be suppressed, and the deterioration in the photoelectric conversion property of the thin film photoelectric conversion element can be further successfully reduced.

EMBODIMENT 7

Figure 10:
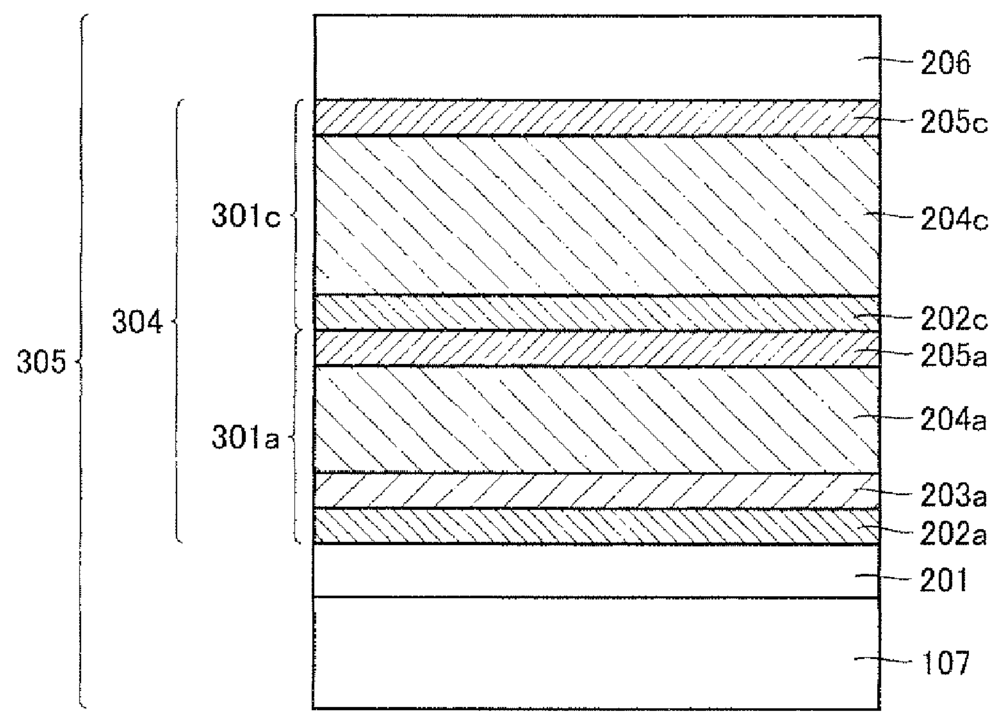
FIG. 10 is a schematic cross sectional view of a thin film photoelectric conversion element as a semiconductor device formed in Embodiment 7 of the technology disclosed herein.

FIG. 10 is a schematic cross sectional view of a thin film photoelectric conversion element as a semiconductor device formed in Embodiment 7 of the technology disclosed herein. In the present embodiment, a description will be given on a case where a semiconductor layer of a thin film photoelectric conversion element with a configuration shown in FIG. 10 is manufactured. In the present embodiment, a description will be given on a case where a crystalline silicon layer is formed as a second pin structure stack body 301*c*. Although the semiconductor layer manufacturing method of the present embodiment is different from that of Embodiment 6 on the point described below, it can be performed as in Embodiment 6 on other points.

In the present embodiment, the first electrode 201 is formed on substrate 107, and the first pin structure stack body 301*a* having a configuration identical to that of Embodiment 6 is formed. Subsequently, the second pin structure stack body 301*c* is formed by successively stacking a first conductive layer 202*c*, a photoelectric conversion layer 204*c*, and a second conductive layer 205*c* made of crystalline silicon layers. The first pin structure stack body 301*a* and the second pin structure stack body 301*c* constitute a double pin structure stack body 304, and the second electrode 206 is formed on double pin structure stack body 304. Thereby, a thin film photoelectric conversion element 305 is completed.

The method of manufacturing a semiconductor layer in a thin film photoelectric conversion element in accordance with the present embodiment will be described in detail below. Firstly, the first pin structure stack body 301*a* is formed by a method as in Embodiment 6. Then, an impurities removing step (ST2) as in Embodiment 1 is performed.

Next, a p-type crystalline silicon layer is formed as the first conductive layer 202*c*. The p-type crystalline silicon layer can be formed, for example, under formation conditions described below. The pressure inside reaction chamber 101 at the time of formation is desirably greater than or equal to 240 Pa and less than or equal to 3600 Pa, and is set to 2000 Pa in the present embodiment. Further, the electric power density per unit area of cathode electrode 102 is desirably greater than or equal to 0.01 W/cm$^2$ and less than or equal to 0.5 W/cm$^2$, and is set to 0.15 W/cm$^2$ in the present embodiment.

As a mixed gas introduced into reaction chamber 101, for example, a gas containing silane gas, hydrogen gas, and diborane gas can be used. A flow rate of the hydrogen gas is desirably about 30 times to several hundred times that of the silane gas, and is set to 100 times in the present embodiment.

The thickness of the first conductive layer 202*c* made of a p-type crystalline silicon layer is preferably greater than or equal to 2 nm to supply a satisfactory internal electric field to photoelectric conversion layer 204*c* made of an i-type crystalline silicon photoelectric conversion layer. On the other hand, the thickness of the first conductive layer 202*c* is desirably as small as possible to suppress the amount of light absorption of the first conductive layer 202*c* as an inactive layer and increase light reaching photoelectric conversion layer 204*c*, and is generally set to less than or equal to 50 nm In the present embodiment, the first conductive layer 202*c* has a thickness of 40 nm.

The first conductive layer 202*c* may be formed of a layer made of an alloy material such as amorphous or crystalline silicon carbide, silicon germanium, or the like. The first conductive layer 202*c* may also be a stack of a plurality of different thin films.

Next, an i-type crystalline silicon photoelectric conversion layer is formed as photoelectric conversion layer 204*c*. Photoelectric conversion layer 204*c* can be formed, for example, under formation conditions described below. The pressure inside reaction chamber 101 at the time of formation is desirably greater than or equal to 240 Pa and less than or equal to 3600 Pa, and is set to 2000 Pa in the present embodiment. Further, the electric power density per unit area of cathode electrode 102 is desirably greater than or equal to 0.02 W/cm$^2$ and less than or equal to 0.5 W/cm$^2$, and is set to 0.15 W/cm$^2$ in the present embodiment.

As a mixed gas introduced into reaction chamber 101, for example, a gas containing silane gas and hydrogen gas can be used. A flow rate of the hydrogen gas is desirably about 30 times to 100 times that of the silane gas, and is set to 80 times in the present embodiment.

The thickness of photoelectric conversion layer 204*c* is preferably greater than or equal to 0.5 μm, and more preferably greater than or equal to 1 μm, to secure the amount of light absorption sufficient as a photoelectric conversion layer. On the other hand, the thickness of photoelectric conversion layer 204*c* is preferably less than or equal to 20 μm, and more preferably less than or equal to 15 μm, to secure good productivity. In the present embodiment, photoelectric conversion layer 204*c* has a thickness of 2 μm.

In the present embodiment, the configuration of the semiconductor layer manufacturing apparatus is set to be most suitable for the formation conditions of the present embodiment in order to form the i-type crystalline silicon layer as photoelectric conversion layer 204*c* with good film quality and at a high formation speed. Specifically, the distance between cathode electrode 102 and anode electrode 103 is set to 15 mm, and the same distance between the electrodes are used throughout the steps.

Thus, an i-type crystalline silicon layer having a good crystallization rate such that a peak intensity ratio $I_{520}/I_{480}$ of a peak at 520 nm$^{-1}$ to a peak at 480 nm$^{-1}$ measured by Raman spectroscopy is greater than or equal to 3 and less than or equal to 10 can be formed as photoelectric conversion layer 204*c*.

As photoelectric conversion layer 204*c*, an i-type crystalline silicon thin film, or a slightly p-type or slightly n-type crystalline silicon thin film containing a slight amount of impurities and having a satisfactory photoelectric conversion function may be used. Further, the material for photoelectric conversion layer 204*c* is not limited to the crystalline thin films described above, and a thin film of such as silicon carbide, silicon germanium, or the like as an alloy material may be used.

Next, an n-type crystalline silicon layer is formed as the second conductive layer 205*c*. The n-type crystalline silicon layer can be formed, for example, under formation conditions described below. The pressure inside reaction chamber 101 at the time of formation is desirably greater than or equal to 240 Pa and less than or equal to 3600 Pa, and is set to 2000 Pa in the present embodiment. Further, the electric power density per unit area of cathode electrode 102 is desirably greater than or equal to 0.02 W/cm$^2$ and less than or equal to 0.5 W/cm$^2$, and is set to 0.15 W/cm$^2$ in the present embodiment.

As a mixed gas introduced into reaction chamber 101, for example, a gas containing silane gas, hydrogen gas, and phosphine gas can be used. A flow rate of the hydrogen gas is desirably about 30 times to several hundred times that of the silane gas, and is set to 80 times in the present embodiment.

The thickness of the second conductive layer 205*c* is preferably greater than or equal to 2 nm to supply a satisfactory internal electric field to photoelectric conversion layer 204*c*. On the other hand, the thickness of the second conductive layer 205*c* is preferably as small as possible to suppress the amount of light absorption of the second conductive layer 205*c* as an inactive layer, and is generally set to less than or equal to 50 nm. In the present embodiment, the second conductive layer 205*c* has a thickness of 40 nm.

The second conductive layer 205*c* may be formed of an alloy material such as amorphous or crystalline silicon carbide, silicon germanium, or the like.

Thus, the first pin structure stack body 301*a* and the second pin structure stack body 301*c* are successively formed in the same reaction chamber 101 to form double pin structure stack body 304.

Thereafter, the second electrode 206 is formed by forming a conductive film of such as ITO, ZnO, or the like and a metal film of such as aluminum, silver, or the like by sputtering, deposition, or the like, and thin film photoelectric conversion element 305 having a silicon-based semiconductor layer can be manufactured.

EXAMPLES

Hereinafter, the technology disclosed herein will be described in more detail with reference to examples, although the technology disclosed herein is not limited thereto.

Experimental Example 1

Figure 11:
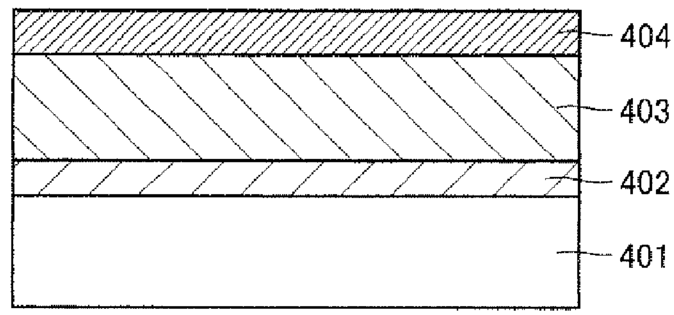
FIG. 11 is a schematic cross sectional view of an experimental sample fabricated in Experimental Example 1.

An experiment described below was performed for the purpose of confirming the effectiveness of the gas replacement operation in the technology disclosed herein. FIG. 11 is a schematic cross sectional view of an experimental sample fabricated in Experimental Example 1. A p-type amorphous silicon semiconductor layer 402 (thickness: about 50 nm) was formed on a glass substrate 401, and then the gas replacement operation was performed using hydrogen gas. Thereafter, an i-type microcrystalline silicon semiconductor layer 403 (thickness about 700 nm) and an amorphous silicon layer 404 (thickness: about 30 nm) were stacked. Amorphous silicon layer 404 stacked finally was formed as a protective film for preventing penetration of impurities from surfaces of p-type amorphous silicon semiconductor layer 402 and i-type microcrystalline silicon semiconductor layer 403.

The gas replacement operation was performed by performing vacuum exhaust after the formation of p-type amorphous silicon semiconductor layer 402 until the pressure inside reaction chamber 101 was reduced to 10 Pa, then introducing hydrogen gas until the pressure inside reaction chamber 101 was increased to 1000 Pa (the replacement gas introducing step), and performing vacuum exhaust again down to 10 Pa (the exhausting step). Further, a sample having the same structure as that of the experimental sample was fabricated without performing the gas replacement operation described above, as a comparative sample. The comparative sample had a structure having p-type amorphous silicon semiconductor layer 402 (thickness: about 50 nm), i-type microcrystalline silicon semiconductor layer 403 (thickness: about 700 nm), and amorphous silicon layer 404 (thickness: about 30 nm), as in the experimental sample.

Figure 12:
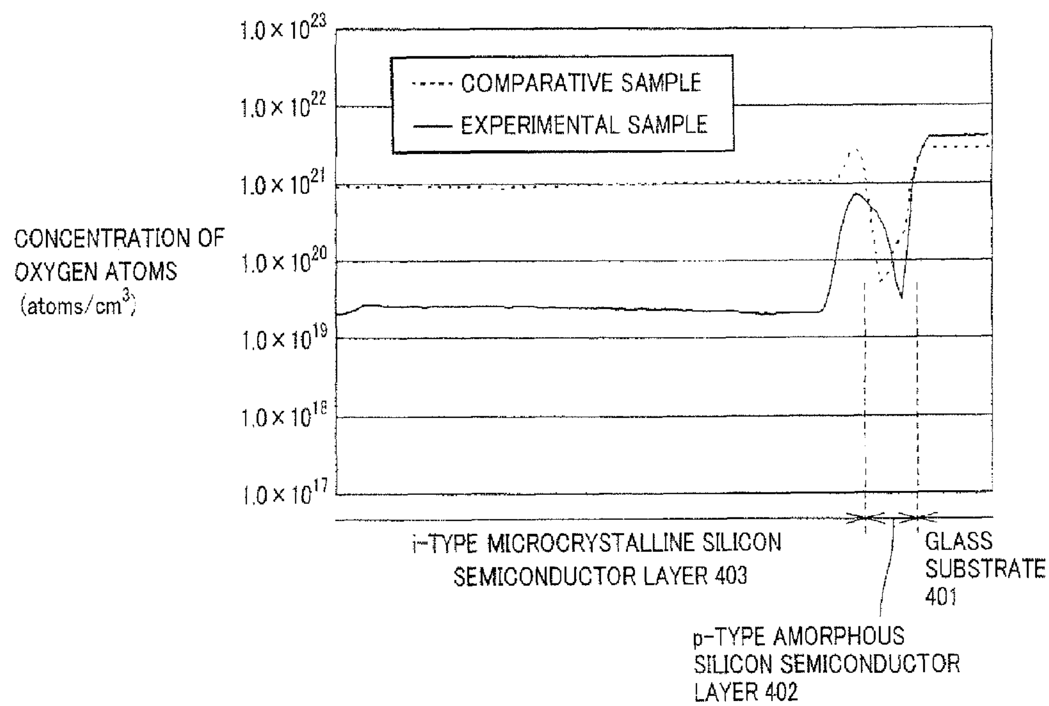
FIG. 12 is a view showing measurement results of concentrations of oxygen atoms in a p-type amorphous silicon semiconductor layer 402 and an i-type microcrystalline silicon semiconductor layer 403 of an experimental sample and a comparative sample, by SIMS (secondary ion mass spectrometry).
Figure 13:
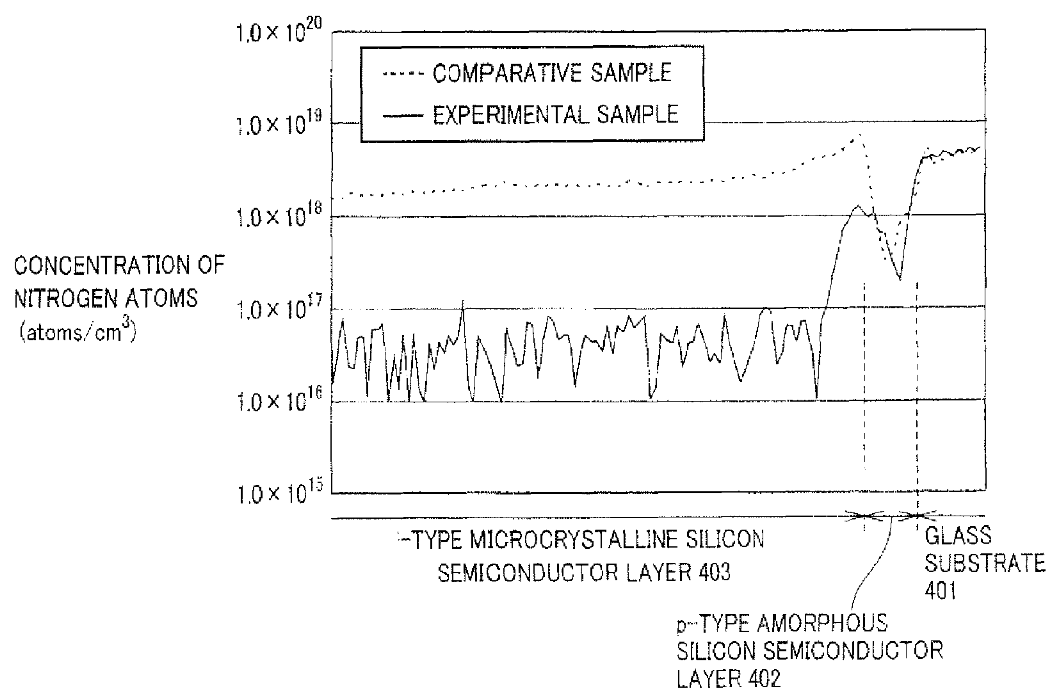
FIG. 13 is a view showing measurement results of concentrations of nitrogen atoms in p-type amorphous silicon semiconductor layer 402 and i-type microcrystalline silicon semiconductor layer 403 of the experimental sample and the comparative sample, by SIMS (secondary ion mass spectrometry).
Figure 14:
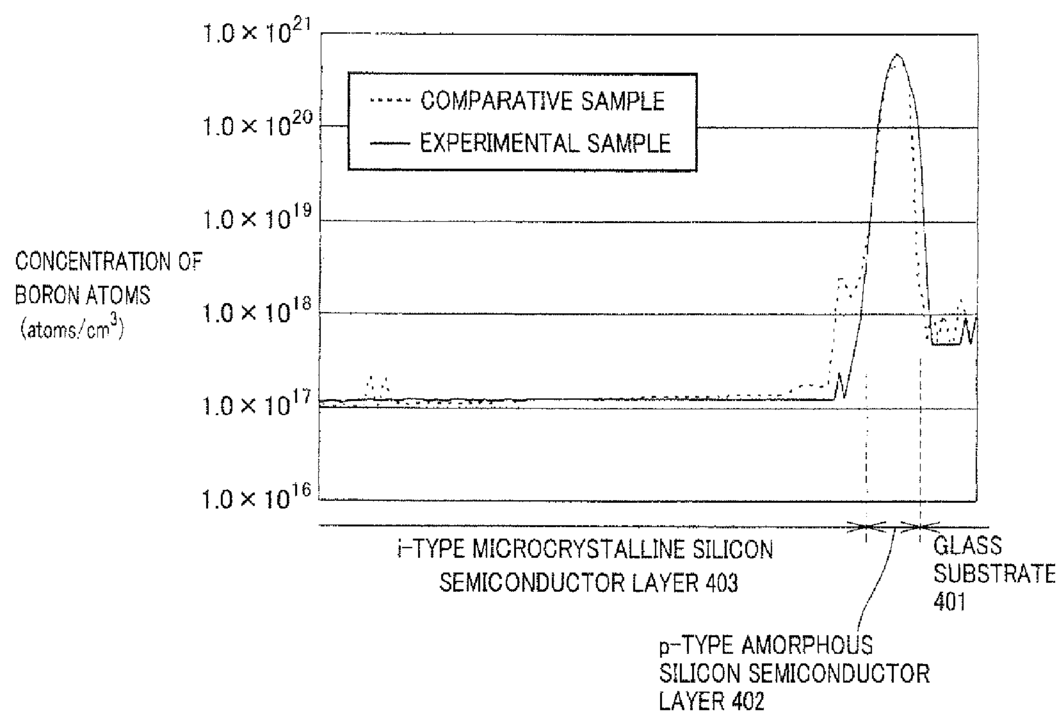
FIG. 14 is a view showing measurement results of concentrations of boron atoms in p-type amorphous silicon semiconductor layer 402 and i-type microcrystalline silicon semiconductor layer 403 of the experimental sample and the comparative sample, by SIMS (secondary ion mass spectrometry).

FIG. 12 is a view showing measurement results of concentrations of oxygen atoms in p-type amorphous silicon semiconductor layer 402 and i-type microcrystalline silicon semiconductor layer 403 of the experimental sample and the comparative sample, by SIMS (secondary ion mass spectrometry). FIG. 13 is a view showing measurement results of concentrations of nitrogen atoms in p-type amorphous silicon semiconductor layer 402 and i-type microcrystalline silicon semiconductor layer 403 of the experimental sample and the comparative sample, by SIMS (secondary ion mass spectrometry). FIG. 14 is a view showing measurement results of concentrations of boron atoms in p-type amorphous silicon semiconductor layer 402 and i-type microcrystalline silicon semiconductor layer 403 of the experimental sample and the comparative sample, by SIMS (secondary ion mass spectrometry). FIGS. 12 to 14 show atom concentration profiles in a film thickness direction of a thin film.

The concentration of boron atoms in p-type amorphous silicon semiconductor layer 402 is $1.0\times10^{20}$ to $10\times10^{21}$ atoms/cm$^3$, and the concentration of boron atoms in i-type microcrystalline silicon semiconductor layer 403 is less than or equal to $1.0\times10^{17}$ atoms/cm$^3$.

As a result of comparing the concentration of impurities in i-type microcrystalline silicon semiconductor layer 403 of the experimental sample with that of the comparative sample, it can be seen from FIG. 12 that, as for oxygen atoms, the amount of impurities in the film is reduced by the gas replacement operation by about two orders of magnitude, proving that the gas replacement operation is effective. Further, it can be seen from FIG. 13 that, as for nitrogen atoms, the amount of impurities in the film is reduced by about one to two orders of magnitude, and it is considered to be reduced by substantially two orders of magnitude because about $1.0\times10^{16}$ to $10\times10^{17}$ atoms/cm$^3$ is the measurement limit of the concentration of nitrogen atoms measured by an SIMS apparatus.

Since a ratio between the pressure inside reaction chamber 101 after introducing hydrogen gas and the pressure inside reaction chamber 101 after performing vacuum exhaust was set to 100 (i.e., 1000 Pa/10 Pa) in the experiment described above, a reduction of the concentration of impurities by about two orders of magnitude was expected, and the reduction of the concentration of impurities by about two orders of magnitude has been confirmed from the results of the experiment.

Further, in the measurement results on the concentrations of boron atoms (i.e., concentrations of a p-type dopant) shown in FIG. 14, the experimental sample subjected to the gas replacement operation has a lower concentration of boron atoms from p-type amorphous silicon semiconductor layer 402 to i-type microcrystalline silicon semiconductor layer 403. It has been found from this result that diffusion of boron from p-type amorphous silicon semiconductor layer 402 to i-type microcrystalline silicon semiconductor layer 403 is suppressed by performing the gas replacement operation.

It is to be noted that the concentration of boron atoms in i-type microcrystalline silicon semiconductor layer 403 at a portion apart from p-type amorphous silicon semiconductor layer 402 is about $1.0\times10^{17}$ in both the experimental sample and the comparative sample, and there is shown no difference therebetween. This is because about $1.0\times10^{17}$ atoms/cm$^3$ is the measurement limit of the concentration of boron atoms measured by an SIMS apparatus.

Further, it can be seen from FIGS. 12 and 13 that, by transferring the substrate into reaction chamber 101, performing vacuum exhaust to reduce the pressure inside reaction chamber 101 to about 10 Pa, then performing the gas replacement operation, and thereafter forming a semiconductor layer, oxygen atoms and nitrogen atoms as impurities incorporated from the air into the semiconductor layer have concentrations of $2.5\times10^{19}$ atoms/cm$^3$ and $4.0\times10^{16}$ atoms/cm$^3$, respectively.

Since the concentrations of oxygen atoms and nitrogen atoms allowable as impurities in a silicon-based semiconductor layer used for a semiconductor device are about $5.0\times10^{19}$ atoms/$cm^3$ and about $1.0\times10^{18}$ atoms/$cm^3$, respectively, it has also been confirmed in the experiment this time that the concentration of impurities in a semiconductor layer can be reduced by performing the gas replacement operation without performing high vacuum exhaust. Although the gas replacement operation was performed only once in the above experiment, the gas replacement operation is repeatedly performed a plurality of times in the present invention to obtain the effect of reducing the concentration of impurities in a semiconductor layer at a practically more successful level.

Example 1

In the present example, a thin film photoelectric conversion element with a configuration shown in FIG. 10 having a photoelectric conversion layer made of an amorphous silicon layer and a photoelectric conversion layer made of a microcrystalline silicon layer was manufactured using a semiconductor layer manufacturing apparatus with a configuration shown in FIG. 1. On the first electrode 201 made of a 1 μm-thick $SnO_2$ film having irregularities formed on substrate 107 made of 4 mm-thick glass, a 10 nm-thick p-type amorphous silicon layer as the first conductive layer 202*a*, a 15 nm-thick i-type amorphous silicon layer as buffer layer 203*a*, a 0.5 μm-thick i-type amorphous silicon layer as photoelectric conversion layer 204*a*, a 30 nm-thick n-type amorphous silicon layer as the second conductive layer 205*a*, a 30 nm-thick p-type microcrystalline silicon layer as the first conductive layer 202*c*, a 3 μm-thick i-type microcrystalline silicon layer as photoelectric conversion layer 204*c*, and a 30 nm-thick n-type microcrystalline silicon layer as the second conductive layer 205*c* were formed. Thereafter, a 0.05 μm-thick ZnO layer and a 0.1 μm-thick Ag electrode were formed as the second electrode 206.

The semiconductor layers described above were successively formed using the same cathode electrode 102 and anode electrode 103 inside the same reaction chamber 101. The temperature of glass substrate 107 was set at 140° C. A high frequency electric power of 13.56 MHz was supplied to cathode electrode 102 to generate plasma between cathode electrode 102 and anode electrode 103, and thereby a mixed gas introduced into reaction chamber 101 was decomposed, and the semiconductor layers were formed. Formation conditions for the respective semiconductor layers will be described in detail below.

Firstly, substrate 107 made of 4 mm-thick glass on which the first electrode 201 made of an $SnO_2$ film having irregularities was formed was placed on cathode electrode 102 inside reaction chamber 101. Then, reaction chamber 101 was exhausted until the pressure inside reaction chamber 101 was reduced to 0.5 Pa, using a vacuum pump provided as gas exhausting portion 116. At a time point when the pressure inside reaction chamber 101 was reduced to 0.5 Pa, hydrogen gas was introduced as a replacement gas from gas introducing portion 110 into reaction chamber 101 (the replacement gas introducing step). When the pressure inside reaction chamber 101 reached 100 Pa, introduction of hydrogen gas was stopped.

Thereafter, reaction chamber 101 was exhausted using the vacuum pump until the pressure inside reaction chamber 101 was reduced to 10 Pa (the exhausting step). The gas replacement operation composed of introduction of hydrogen gas and exhaust of reaction chamber 101 described above was repeated four times (the impurities removing step).

Next, on the first electrode 201 made of the $SnO_2$ film having irregularities formed on glass substrate 107, a 10 nm-thick p-type amorphous silicon layer was formed as the first conductive layer 202*a*, under conditions that the pressure inside reaction chamber 101 was 500 Pa and the electric power density per unit area of cathode electrode 102 was 0.05 W/$cm^2$.

Subsequently, reaction chamber 101 was exhausted using the vacuum pump until the pressure inside reaction chamber 101 was reduced to 0.5 Pa. At a time point when the pressure inside reaction chamber 101 was reduced to 0.5 Pa, hydrogen gas was introduced as a replacement gas into reaction chamber 101 (the replacement gas introducing step). When the pressure inside reaction chamber 101 reached 100 Pa, introduction of hydrogen gas was stopped. Thereafter, reaction chamber 101 was exhausted using the vacuum pump until the pressure inside reaction chamber 101 was reduced to 10 Pa (the exhausting step). The gas replacement operation composed of introduction of hydrogen gas and exhaust of reaction chamber 101 described above was repeated four times (the impurities removing step).

Next, on the p-type amorphous silicon layer as the first conductive layer 202*a*, a 7.5 nm-thick i-type amorphous silicon layer was formed as a portion of buffer layer 203*a* by plasma CVD, under conditions that the pressure inside reaction chamber 101 was 500 Pa and the electric power density per unit area of cathode electrode 102 was 0.07 W/$cm^2$.

Subsequently, reaction chamber 101 was exhausted using the vacuum pump until the pressure inside reaction chamber 101 was reduced to 0.5 Pa. At a time point when the pressure inside reaction chamber 101 was reduced to 0.5 Pa, hydrogen gas was introduced as a replacement gas into reaction chamber 101 (the replacement gas introducing step). When the pressure inside reaction chamber 101 reached 100 Pa, introduction of hydrogen gas was stopped. Thereafter, reaction chamber 101 was exhausted using the vacuum pump until the pressure inside reaction chamber 101 was reduced to 10 Pa (the exhausting step). The gas replacement operation composed of introduction of hydrogen gas and exhaust of reaction chamber 101 described above was repeated four times (the impurities removing step).

Next, on the i-type amorphous silicon layer as a portion of buffer layer 203*a*, a 7.5 nm-thick i-type amorphous silicon layer was formed as a remaining portion of buffer layer 203*a* by plasma CVD, under conditions that the pressure inside reaction chamber 101 was 500 Pa and the electric power density per unit area of cathode electrode 102 was 0.07 W/$cm^2$. Thereby, buffer layer 203*a* with a thickness of 15 nm was formed.

Subsequently, reaction chamber 101 was exhausted using the vacuum pump until the pressure inside reaction chamber 101 was reduced to 0.5 Pa. At a time point when the pressure inside reaction chamber 101 was reduced to 0.5 Pa, hydrogen gas was introduced as a replacement as into reaction chamber 101 (the replacement gas introducing step). When the pressure inside reaction chamber 101 reached 100 Pa, introduction of hydrogen gas was stopped. Thereafter, reaction chamber 101 was exhausted using the vacuum pump until the pressure inside reaction chamber 101 was reduced to 10 Pa (the exhausting step) The gas replacement operation composed of introduction of hydrogen gas and exhaust of reaction chamber 101 described above was repeated four times (the impurities removing step).

Next, on the i-type amorphous silicon layer as buffer layer 203*a*, a 0.5 μm-thick i-type amorphous silicon layer was formed as photoelectric conversion layer 204*a*, under conditions that the pressure inside reaction chamber 101 was 500 Pa and the electric power density per unit area of cathode electrode 102 was 0.07 W/$cm^2$.

Then, on the i-type amorphous silicon layer as photoelectric conversion layer 204*a*, a 30 nm-thick n-type amorphous silicon layer was formed as the second conductive layer 205*a*, under conditions that the pressure inside reaction chamber 101 was 500 Pa and the electric power density per unit area of cathode electrode 102 was 0.05 W/$cm^2$.

Next, on the n-type amorphous silicon layer as the second conductive layer 205*a*, a 30 nm-thick p-type microcrystalline silicon layer was formed as the first conductive layer 202*c*, under conditions that the pressure inside reaction chamber 101 was 800 Pa and the electric power density per unit area of cathode electrode 102 was 0.08 W/$cm^2$.

Subsequently, reaction chamber 101 was exhausted using the vacuum pump until the pressure inside reaction chamber 101 was reduced to 0.5 Pa. At a time point when the pressure inside reaction chamber 101 was reduced to 0.5 Pa, hydrogen gas was introduced as a replacement gas into reaction chamber 101 (the replacement gas introducing step). When the pressure inside reaction chamber 101 reached 100 Pa, introduction of hydrogen gas was stopped. Thereafter, reaction chamber 101 was exhausted using the vacuum pump until the pressure inside reaction chamber 101 was reduced to 10 Pa (the exhausting step). The gas replacement operation composed of introduction of hydrogen gas and exhaust of reaction chamber 101 described above was repeated four times (the impurities removing step).

Next, on the p-type microcrystalline silicon layer as the first conductive layer 202*c*, a 3 μm-thick i-type microcrystalline silicon layer was formed as photoelectric conversion layer 204*c*, under conditions that the pressure inside reaction chamber 101 was 800 Pa and the electric power density per unit area of cathode electrode 102 was 0.10 W/$cm^2$.

Then, on the i-type microcrystalline silicon layer as photoelectric conversion layer 204*c*, a 30 nm-thick n-type microcrystalline silicon layer was formed as the second conductive layer 205*c*, under conditions that the pressure inside reaction chamber 101 was 800 Pa and the electric power density per unit area of cathode electrode 102 was 0.08 W/$cm^2$.

Thereafter, a 0.05 μm-thick ZnO layer and a 0.1 μm-thick Ag electrode were formed as the second electrode 206 by sputtering, and thus a thin film photoelectric conversion element was formed.

Comparative Example 1

A thin film photoelectric conversion element was formed as in Example 1, except that the p-type layers, the i-type layers, and the n-type layers were formed inside respective different reaction chambers.

Figure 15:
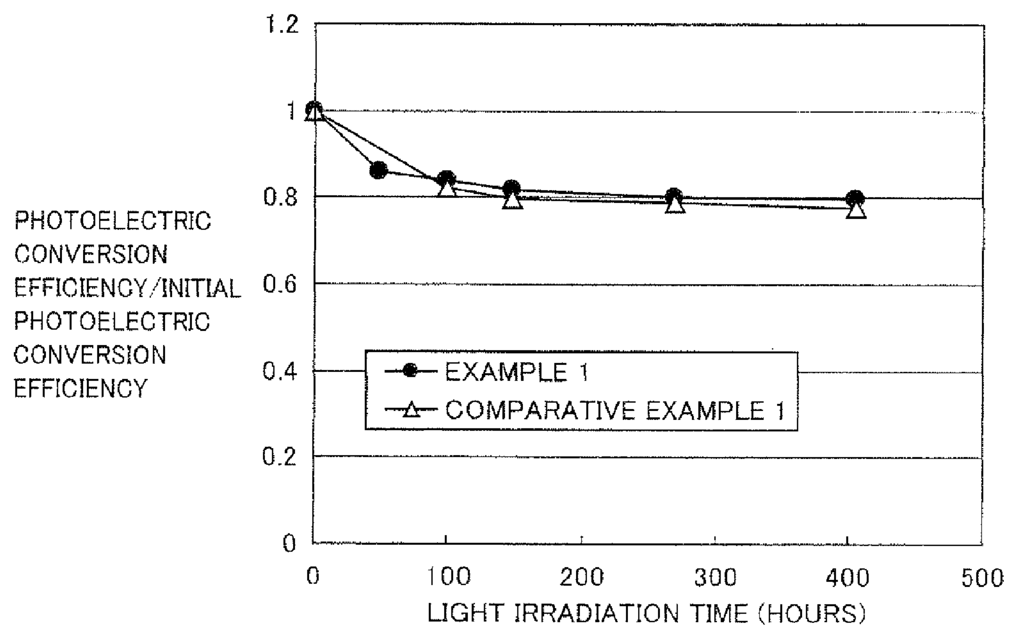
FIG. 15 is a view showing light degradation properties of photoelectric conversion efficiencies of thin film photoelectric conversion elements formed in Example 1 and Comparative Example 1.

FIG. 15 is a view showing light degradation properties of photoelectric conversion efficiencies of thin film photoelectric conversion elements formed in Example 1 and Comparative Example 1. A light degradation property is determined by normalizing a change over time in photoelectric conversion efficiency in a case where a thin film photoelectric conversion element is irradiated with light with an AM of 1.5, by an initial photoelectric conversion efficiency. In FIG. 15, the thin film photoelectric conversion element formed in Example 1 exhibited a light degradation property equivalent to that of the thin film photoelectric conversion element formed in Comparative Example 1.

It has been found from the results described above that, even when a semiconductor layer is formed by the single chamber system, a semiconductor device having an excellent property such as a thin film photoelectric conversion element capable of securing a good photoelectric conversion property for a long period of time can be formed by employing the manufacturing method of the technology disclosed herein.

It should be understood that the embodiments and the examples disclosed herein are illustrative and non-restrictive in every respect. The scope of the technology disclosed herein is defined by the scope of the claims, rather than the description above, and is intended to include any modifications within the scope and meaning equivalent to the scope of the claims.

INDUSTRIAL APPLICABILITY

The semiconductor layer manufacturing method and the semiconductor layer manufacturing apparatus of the technology disclosed herein are suitably applicable to, for example, manufacture of a semiconductor device such as a thin film photoelectric conversion element, a display, or the like.

The invention claimed is:

1. A semiconductor layer manufacturing method of forming a semiconductor layer inside a reaction chamber capable of being hermetically sealed, comprising:

an impurities removing step of removing impurities inside said reaction chamber using a replacement gas; and a semiconductor layer forming step of forming said semiconductor layer, said impurities removing step being a step in which a cycle composed of a replacement gas introducing step of introducing the replacement gas into said chamber is repeated a plurality of times, said impurities removing step being performed at least before the semiconductor layer forming step in said replacement gas introducing step, said replacement gas is introduced into said reaction chamber to have a pressure greater than or equal to a pressure after introducing the replacement gas that has been set beforehand, in said exhausting step, the inside of said reaction chamber is exhausted to have a pressure less than or equal to a pressure after exhaust that has been set beforehand, and a number n (unit: number of times) of said cycle satisfies an expression:

$$[N]_o \times (M/m)^n \leqq [N],$$

where [N] (unit: atoms/$cm^3$) represents an allowable concentration of impurity atoms inside said reaction chamber immediately before said semiconductor layer forming step that has been set beforehand, $[N]_o$ (unit: atoms/$cm^3$) represents a concentration of impurity atoms inside said reaction chamber before starting said cycle, m (unit: Pa) represents said pressure after introducing the replacement gas, and M (unit: Pa) represents said pressure after exhaust.

2. The semiconductor layer manufacturing method according to claim 1, wherein said semiconductor layer includes a plurality of layers having different conductivity types, and said semiconductor layer is formed inside the same said reaction chamber.

3. The semiconductor layer manufacturing method according to claim 1, wherein a background pressure inside said reaction chamber immediately before said semiconductor layer forming step is greater than or equal to 0.1 Pa and less than or equal to 10000 Pa.

4. A semiconductor layer manufacturing apparatus used for the semiconductor layer manufacturing method according to claim 1, comprising:

a reaction chamber capable of being hermetically sealed for forming a semiconductor layer therein;

a gas introducing portion for introducing a replacement gas into said reaction chamber; and a gas exhausting portion for exhausting the replacement gas from said reaction chamber.

5. A semiconductor layer manufacturing method of forming a semiconductor layer inside a reaction chamber capable of being hermetically sealed, comprising:

an impurities removing step of removing impurities inside said reaction chamber using a replacement gas; and a semiconductor layer forming step of forming said semiconductor layer, said impurities removing step being a step in which a cycle composed of a replacement gas introducing step of introducing the replacement gas into said reaction chamber and an exhausting step of exhausting an inside of said reaction chamber is repeated a plurality of times, said impurities removing step being performed at least before the semiconductor layer forming step, said semiconductor layer is a semiconductor layer used in a photoelectric conversion element, and includes a p-type layer, an i-type layer, and an n-type layer, said semiconductor layer forming step includes:

a first conductive layer forming step of forming a first conductive layer made of a p-type layer or an n-type layer;

a photoelectric conversion layer forming step of forming a photoelectric conversion layer made of an i-type layer on said first conductive layer; and a second conductive layer forming step of forming a second conductive layer made of a p-type layer or an n-type layer on said photoelectric conversion layer, and said first conductive layer and said second conductive layer are formed to have conductivity types different from each other.

6. The semiconductor layer manufacturing method according to claim 5, further comprising a buffer layer forming step of forming a buffer layer made of an i-type layer between said first conductive layer forming step and said photoelectric conversion layer forming step.

7. The semiconductor layer manufacturing method according to claim 6, further comprising said impurities removing step between said first conductive layer forming step and said buffer layer forming step.

8. The semiconductor layer manufacturing method according to claim 6, further comprising said impurities removing step between said buffer layer forming step and said photoelectric conversion layer forming step.

9. The semiconductor layer manufacturing method according to claim 6, wherein said buffer layer includes a plurality of layers, and said impurities removing step is further performed after each buffer layer is formed in said buffer layer forming step.

10. The semiconductor layer manufacturing method according to claim 5, wherein said replacement gas is at least any of gases used to form an i-type layer.

11. The semiconductor layer manufacturing method according to claim 5, wherein said semiconductor layer is made of a stack body of a plurality of pin semiconductors.

12. The semiconductor layer manufacturing apparatus according to claim 4, wherein said gas exhausting portion includes at least any of a rotary pump, a mechanical booster pump, and a sorption pump.

13. A semiconductor layer manufacturing apparatus used for the semiconductor layer manufacturing method according to claim 5, comprising:

a reaction chamber capable of being hermetically sealed for forming a semiconductor layer therein;

a gas introducing portion for introducing a replacement gas into said reaction chamber; and a gas exhausting portion for exhausting the replacement gas from said reaction chamber.

* * * * *